United States Patent
Tanaka et al.

(10) Patent No.: US 8,562,906 B2
(45) Date of Patent: Oct. 22, 2013

(54) LEAD-FREE SOLDER ALLOY, SOLDER BALL AND ELECTRONIC MEMBER, AND LEAD-FREE SOLDER ALLOY, SOLDER BALL AND ELECTRONIC MEMBER FOR AUTOMOBILE-MOUNTED ELECTRONIC MEMBER

(75) Inventors: Masamoto Tanaka, Futtsu (JP); Tsutomu Sasaki, Futtsu (JP); Takayuki Kobayashi, Futtsu (JP); Kazuto Kawakami, Futtsu (JP); Masayoshi Fujishima, Iruma (JP)

(73) Assignees: Nippon Steel & Sumikin Materials Co., Ltd., Tokyo (JP); Nippon Micrometal Corporation, Saitama (JP)

( * ) Notice: Subject to any disclaimer, the term of this patent is extended or adjusted under 35 U.S.C. 154(b) by 403 days.

(21) Appl. No.: 12/281,430

(22) PCT Filed: Mar. 8, 2007

(86) PCT No.: PCT/JP2007/054581
§ 371 (c)(1),
(2), (4) Date: Dec. 2, 2008

(87) PCT Pub. No.: WO2007/102588
PCT Pub. Date: Sep. 13, 2007

(65) Prior Publication Data
US 2009/0304545 A1 Dec. 10, 2009

(30) Foreign Application Priority Data

Mar. 9, 2006 (JP) ................................. 2006-064125
Mar. 9, 2006 (JP) ................................. 2006-064126
Mar. 9, 2006 (JP) ................................. 2006-064128

(51) Int. Cl.
*C22C 13/00* (2006.01)
*C22C 13/02* (2006.01)

(52) U.S. Cl.
USPC .......................................... 420/560; 420/561

(58) Field of Classification Search
USPC .................................. 420/560, 561
See application file for complete search history.

(56) References Cited

U.S. PATENT DOCUMENTS

| | | |
|---|---|---|
| 6,139,979 A | 10/2000 | Takaoka et al. |
| 6,179,935 B1 | 1/2001 | Yamashita et al. |
| 2002/0117539 A1 | 8/2002 | Ito et al. |
| 2002/0159913 A1 | 10/2002 | Ito et al. |
| 2003/0021718 A1 | 1/2003 | Munekata et al. |
| 2004/0062679 A1* | 4/2004 | Munekata et al. ............ 420/560 |

FOREIGN PATENT DOCUMENTS

| | | | |
|---|---|---|---|
| JP | 05050286 A | 3/1993 | |
| JP | 11077366 A | 3/1999 | |
| JP | 11277290 A | 10/1999 | |
| JP | 2001096394 A | 4/2001 | |
| JP | 2001504760 A | 4/2001 | |
| JP | 3296289 B | 6/2002 | |
| JP | 2002239780 A | 8/2002 | |
| JP | 2002246742 A | 8/2002 | |
| JP | 2003094195 A | 4/2003 | |
| JP | 2003230980 A | 8/2003 | |
| JP | 2004141910 A | 5/2004 | |
| JP | 2005153007 A | 6/2005 | |
| JP | 2005246480 A | 9/2005 | |
| WO | 98/34755 A1 | 8/1998 | |

OTHER PUBLICATIONS

Tanaka et al., English machine translation of JP 2003-230980, Aug. 2003.*

* cited by examiner

*Primary Examiner* — Roy King
*Assistant Examiner* — Caitlin Kiechle
(74) *Attorney, Agent, or Firm* — Troutman Sanders LLP

(57) ABSTRACT

A lead-free solder alloy exhibiting good performance in impact resistance and vibration resistance. Also provided are a solder ball using such a lead-free solder alloy, and an electronic member having a solder bump using such a lead-free alloy. Specifically, the lead-free solder alloy consists of 1.0 to 2.0% by mass of Ag, 0.3 to 1.0% by mass of Cu, 0.005 to 0.1% by mass of Ni and the balance including Sn and unavoidable impurities. In an Sn—Ag—Cu based solder joint portion on a Cu electrode, a $Cu_3Sn$ intermetallic compound layer is formed directly on the Cu electrode, and then a $Cu_6Sn_5$ intermetallic compound layer is formed thereon. A Cu atomic site in the $Cu_6Sn_5$ intermetallic compound layer is replaced by Ni having a smaller atomic radius than Cu to thereby reduce strain in the $Cu_6Sn_5$ intermetallic compound layer, thus enabling impact resistance and vibration resistance to be improved therein.

18 Claims, No Drawings

LEAD-FREE SOLDER ALLOY, SOLDER BALL AND ELECTRONIC MEMBER, AND LEAD-FREE SOLDER ALLOY, SOLDER BALL AND ELECTRONIC MEMBER FOR AUTOMOBILE-MOUNTED ELECTRONIC MEMBER

CROSS-REFERENCE TO RELATED APPLICATIONS

The present application is a National Stage of International Application No. PCT/JP2007/054581, filed Mar. 8, 2007. The International Application claims priority to Japanese Applications Nos. 2006-064125, 2006-064126, and 2006-064128 all filed Mar. 9, 2006. The International Application published as WO 2007/102588.

TECHNICAL FIELD

The present invention relates to a lead-free solder alloy, a solder ball using the lead-free solder alloy and an electronic member including a solder bump formed by using such lead-free solder alloy, as well as a lead-free solder alloy for use as an automobile-mounted electronic member, a solder ball using such lead-free solder alloy and an automobile-mounted electronic member including a solder bump formed by using such lead-free solder alloy.

BACKGROUND ART

With miniaturization and high-density mounting of electronic components in recent years, BGA (a ball grid array) and CSP (a chip size package) technologies have come into use when mounting electronic components on a printed-wiring board or the like. Electrodes employed in those technologies also are getting increasingly miniaturized.

In joining these electronic components, solder bumps are initially formed in a plurality of electrodes arranged on semiconductor substrates, electronic components, printed-wiring boards or the like. Formation of the solder bumps on the electrodes on the electronic members is performed by allowing solder balls to adhere to respective electrodes using adhesive force of flux and then heating the electronic members to a high temperature to reflow the solder balls. Semiconductor substrates etc. and printed-wiring boards etc. are joined together through the solder bumps. Here, the term "solder bump" means a solder formed in a hemispherically-raised shape on a plated layer on a copper or aluminum wiring electrode.

In order to minimize an influence upon the environment at the time of disposal of discarded electronic devices, solder alloys used for electronic devices have also come to require lead-free ones. Examples of such lead-free solder alloys include, as a binary alloy, the one comprised of Sn containing 3.5% Ag, which has been extensively used, since that composition provides eutectic composition, indicating a comparatively low melting point as low as 221 deg C.

With the high-density mounting of electronic components in recent years, surface mounting and BGA mounting have progressed particularly in the fields of notebook computers, video cameras, mobile phones, automobile-mounted electronic members and electronic equipment and the like so that scaling down in a pad area of a substrate electrode has been progressing rapidly, thus having forced the amounts of solders used in solder joints to be decreased. That is, junction areas in soldered portions have been decreased, thus resulting in increased stresses being applied to the junction. Further, since the high-density mounting has caused communication devices to become increasingly sophisticated and miniaturized, portability of communication devices also has progressed rapidly. Additionally, economic activities having been expanded on a global scale has caused such devices to be used in places no one has ever though of, such as burning deserts or under extreme cold conditions in polar zones and highlands, which requires that soldering mounting be designed, taking the fact that the soldered junctions may be exposed to an even severer environment into consideration. Accordingly, demands for improvement in fatigue resistance of solder materials have increased further. In patent document 1, there is disclosed, as a lead-free solder for electronic equipment, a high-temperature solder consisting of 3.0 to 5.0% of Ag, 0.5 to 3.0% of Cu, and a balance of Sn, which is excellent in thermal fatigue resistance. With respect to a content of Ag, the document teaches that the addition of Ag exerts a significant effect on improvement in the thermal fatigue resistance, whereas if an additive amount of Ag is 3.0% or below, the improvement effect is insufficient.

Besides, in the case of portable digital products such as a mobile phone or the like, it is necessary to assume such situation that the products may be accidentally dropped on a floor surface or struck against the same during the use thereof, in view of the specific manner they are actually used. Accordingly, they are required to have impact resistance sufficient to cause no destruction to the soldered junctions of electronic components used, even if they are subjected to impacts like the above-mentioned. Whereas, according to the conventional fatigue-resistant solder alloys, improvement of the fatigue resistance has been realized mainly by increasing the strength of the solder, so that there has been a tendency that the impact resistance rather deteriorates. In order to improve the impact resistance and vibration resistance of soldered junctions, an alloy excellent in ductility is most effectively used as a soldering alloy of the joints.

Further, automobile-mounted electronic components are required to have sufficient durability against vibrations generated during the travel. Accordingly, they are required to have vibration resistance enough to keep the soldered junctions of the electronic components from being damaged even against such repetitive vibrations. Whereas, according to the conventional fatigue-resistant solder alloys, improvement of fatigue resistance has been realized mainly by increasing the strength of the solder, so that there has been a tendency that the vibration resistance rather deteriorate. In order to improve the vibration resistance of soldered junctions, an alloy excellent in ductility is most effectively used as a soldering alloy of the joints, as is the case with the above-mentioned improvement of the vibration resistance.

In patent document 2, there is disclosed a lead-free solder alloy which has a lower Ag content than that disclosed in the patent document 1 and is excellent in drop-impact resistance, wherein the lead-free solder consists of 1.0 to 2.0% by mass of Ag, 0.3 to 1.5% by mass of Cu and a balance of Sn and unavoidable impurities. As a result, the lead-free solder according to the patent document 2 enables the lead-free solder to be provided at lower cost than by the conventional ones, thus realizing extremely excellent thermal fatigue resistance and impact resistance at the same time. The patent document 2 teaches that for the purpose of improving strength of the solder alloy, 0.05 to 1.5% by mass of Ni or 0.005 to 0.5% by mass of Fe may preferably be added.

In patent document 3, there is disclosed a lead-free solder alloy for improving impact resistance and heat cycle resistance, wherein the lead-free solder consists of 0.01 to 1% by mass of Sb, 0.01 to 0.5% by mass of Ni, and a balance of Sn, with additives of 0.01 to 5% by mass of Ag and/or 0.01 to 2% by mass of Cu. The patent document 3 teaches that Sb has the effect of improving impact resistance, while Ni has the effect of improving heat cycle resistance, and that the addition of Cu further improves the impact resistance, while the addition of Ag further improves the heat cycle resistance.

In patent document 4, there is disclosed a solder alloy which is thermally stable, excellent in joining property, and excellent in strength, wherein the solder alloy primarily consists of Sn, further containing: 1.0 to 4.0% by weight of Ag; 2.0% or less by weight of Cu; and 1.0% or less by weight of Ni. The patent document 4 teaches that Cu improves the strength and heat resistance of an alloy without impairing wettability, and that the addition of Ni increases the thermal stability of an alloy, improving the strength and thermal fatigue resistance thereof, while suppressing the formation of intermetallic compound which causes joining strength to be reduced when joined to a cupper substrate.

In patent document 5 is disclosed an invention in which Sn-4.7% Ag-1.7% Cu solder alloy comprises an additive element selected from among Ni, Fe and Co. The patent document 5 teaches that each additive element may be present in an amount of at least about 0.01 weight % so that the Cu substrate/solder interface morphology is improved, and particularly the thickness of the as-solidified intermetallic interface is reduced.

Patent Document 1: Japanese unexamined patent application publication No. H5-50286
Patent Document 2: Japanese unexamined patent application publication No. 2002-239780
Patent Document 3: Japanese unexamined patent application publication No. 2004-141910
Patent Document 4: Japanese registered patent publication No. 3296289
Patent Document 5: Japanese unexamined patent application publication No. 2001-504760

DISCLOSURE OF THE INVENTION

Problem to be Solved by the Invention

With respect to the impact resistance of a solder alloy, an electrode on a silicon chip and an electrode on a printed-wiring board are soldered together to thereby prepare a solder joint and then the member thus prepared is put on a surface table, and a rod-type probe is then iteratively dropped thereon until the solder joint gives rise to fracture, thus obtaining a drop count required for the fracture to occur so that it can be evaluated as a drop impact resistance drop count.

With respect to the lead-free solder alloys described in the documents 1 to 5, the drop impact resistance drop count was in the order of 50 to 60 when the impact resistance was evaluated by a drop test at about 1,500 G using the above-mentioned method.

Recently, demands for the impact resistance of solder alloys have got severer. In the impact resistance evaluation where an impact at about 10,000 G is applied by dropping a rod type probe of 30 g from a height of 5 cm in a rod type probe drop test, the impact resistance excellent enough to withstand more than 60 drop count has come to be required. Under such severe condition, the impact resistant drop count of the conventional solder alloys is as few as less than 30 times.

On the other hand, vibration resistance of solder alloys can be evaluated by subjecting a printed-wiring board mounted with electronic components to a three-point-supporting reverse bend test. Since an extremely high performance is required for automobile-mounted electronic components, evaluation test is carried out under such an overload condition that causes as much as 3 mm or more bending deflection.

When the lead-free solder alloys disclosed in the patent documents 1 to 4 were evaluated for the vibration resistance using the forgoing method, the test result exhibited the durability to withstand about 800 times or less of the bending test in the case of forming the solder joint on a Cu—OSP electrode, while the durability to withstand about 200 times or less of the bending test in the case of forming the joint on a Ni/Au electrode.

In the recent automobile-mounted electronic components, the demands for the vibration resistance of the solder alloy have become even severer. In the above-mentioned bending test for evaluating the vibration resistance, vibration resistance excellent enough to exhibit durability of 1,000 or more times in the case of forming the solder joint on a Cu—OSP electrode as well as that of 200 or more times in the case of forming the solder joint on the Ni/Au electrode has come to be required.

It is an object of the present invention to provide a lead-free solder alloy that realizes the forgoing target performances for the impact resistance, a solder ball using such lead-free solder alloy, and an electronic member having solder bumps formed by using such lead-free solder alloy.

Further, it is an object of the present invention to provide a lead-free solder alloy for use as an automobile-mounted electronic member that realizes the forgoing target performances for the vibration resistance, a solder ball using such lead-free solder alloy, and an electronic member having solder bumps formed by using such lead-free solder alloy.

Mean for Solving the Problem

When forming a joint using an Sn—Ag—Cu-based lead-free solder alloy on a Cu electrode, a $Cu_3Sn$ intermetallic compound layer is formed directly on the Cu electrode and then a $Cu_6Sn_5$ intermetallic compound layer is formed thereon and eventually a solder-alloy layer is formed thereon. Likewise, when forming a solder joint using the Sn—Ag—Cu-based lead-free solder alloy on a typical Cu/Ni/Au-plated substrate, a $Ni_3Sn_4$ intermetallic compound layer is formed on a Ni electrode and then a $Cu_6Sn_5$ intermetallic compound layer is formed thereon and eventually the solder-alloy layer is formed thereon.

The evaluation tests performed for evaluating the impact resistance of solder bumps formed on the foregoing electrodes reveal that, with respect to the solder bumps formed on the Cu electrode, fractures occur in an interface between the $Cu_3Sn$ intermetallic compound and the $Cu_6Sn_5$ intermetallic compound, while with respect to the solder bumps formed on the Cu/Ni/Au-plated substrate, fractures occur in an interface between the $Ni_3Sn_4$ intermetallic compound and the $Cu_6Sn_5$ intermetallic compound. In either case, the fractures occur in the interface between the intermetallic compound layers formed in two layers.

Strains between the $Cu_6Sn_5$ intermetallic compound layers are considered to be a possible primary cause of these fracture occurrences. If it is true, then the occurrences of the fractures can be restrained between the intermetallic compound layers formed in two layers by relieving the strains between the $Cu_6Sn_5$ intermetallic compound layers, so that the impact resistance of the solder joint should eventually be improved.

By replacing a Cu atomic site in the $Cu_6Sn_5$ intermetallic compound layer by an atomic species having a smaller atomic radius than Cu, the strains between the $Cu_6Sn_5$ intermetallic compound layers can be reduced. Ni corresponds to the atomic species having a smaller atomic radius than Cu. Further, it was found out that the inclusion of a small amount of Fe in a solder alloy enables the Cu atoms in the $Cu_6Sn_5$ intermetallic compounds to be efficiently replaced by Ni and Co.

Then, the Sn—Ag—Cu-based lead-free solder containing 1.0 to 2.0% by mass of Ag and 0.3 to 1.0% by mass of Cu was allowed to contain 0.005 to 0.10% by mass of Ni, and then a solder joint with the Cu electrode was formed using this solder alloy to evaluate its impact resistance thereof. The evaluation test revealed that the impact resistant drop count exceeded 60 times and thus the drop-impact resistance was improved. When 0.0001 to 0.005% by mass of Fe was further added to the foregoing solder alloy and formed a joint with an electrode using this solder alloy to subject it to the impact resistance evaluation test, it was revealed that the impact resistant drop count exceeded 80 times and thus the impact resistance was remarkably improved. By allowing the above composition to further contain 0.005 to 0.1% by mass of Co, further improvement in impact resistance can be effected.

Further, the reverse bend test for evaluating the vibration resistance of the solder bump formed on the electrode revealed that parts where cracks finally occur vary depending on the composition of a solder alloy. As described in the patent document 1, as for the Sn—Ag—Cu solder alloy containing an Ag content of 3 to 4% by mass, fractures occur in the interface between the $Cu_3Sn$ intermetallic compound and the $Cu_6Sn_5$ intermetallic compound in the case of a solder bump being formed on the Cu electrode, while fractures occur in the interface between the $Ni_3Sn_4$ intermetallic compound and the $Cu_6Sn_5$ intermetallic compound in the case of a solder bump being formed on the Cu/Ni/Au-plated substrate. In either case, the fractures occur in the interfaces between the intermetallic compound layers formed in two layers. On the other hand, as described in the patent document 2, as for the Sn—Ag—Cu solder alloy containing an Ag content of about 1 to 2% by mass, fractures do not occur in the intermetallic compound layers but develop inside a region of the solder alloy. In other words, the solder alloy containing Ag content of 3 to 4% by mass has a high fatigue strength by itself but has an insufficient fatigue strength in the intermetallic compound layers, while the solder alloy containing such a little Ag content as on the order of 1 to 2% by mass has an insufficient fatigue strength, so that in either case, the vibration resistance has been limited.

As discussed above, it has been found out that in order to improve vibration resistance of the solder alloy used for automobile-mounted electronic members, it is necessary to increase the fatigue strength of the solder alloy itself and that of the intermetallic compound layers formed in an interface between an electrode and the solder alloy at the same time. Among them, for the increase in fatigue strength of the intermetallic compound layer formed in the interface between the electrode and the solder alloy, strains between the $Cu_6Sn_5$ intermetallic compound layers can be considered to be a main cause of the fracture that occurs in the interface of the intermetallic compound layers. Accordingly, as is the case with the improvement in the impact resistance discussed above, reducing the strains between the $Cu_6Sn_5$ intermetallic compound layers should be able to suppress the occurrence of fractures between the intermetallic compound layers, and as a result, the vibration resistance of the solder alloy should be improved.

On the other hand, as for the increase in fatigue strength of a solder alloy itself, it has been found out that the strength of the solder alloy is increased by adding a slight amount of Fe, Ni, Co or the like to the alloy, thus resulting in the improvement of the fatigue strength of the solder alloy.

The present invention has been made based on the forgoing findings and the subject matter of the invention is described as below:

A lead-free solder alloy according to a first aspect consists of:
1.0 to 2.0% by mass of Ag;
0.3 to 1.0% by mass of Cu;
0.005 to 0.10% by mass of Ni; and
a balance including Sn and unavoidable impurities.

The lead-free solder alloy according to a second aspect is the one in which a content of Ni is in a range of from 0.005 to 0.07% by mass.

The lead-free solder alloy according to a third aspect is the one set forth in the first or second aspect, further containing 0.0001 to 0.005% by mass of Fe.

The lead-free solder alloy according to a fourth aspect is the one set forth in the third aspect, further containing 0.005 to 0.10% by mass of Co, wherein a total content of Ni, Co and Fe is 0.10% or less by mass.

The lead-free solder alloy according to a fifth aspect is the one set forth in the third aspect, further containing 0.005 to 0.10% by mass of Co, wherein a content ratio of Ni, Co, Fe is 10:3 to 7:0.02 to 2, respectively.

The lead-free solder alloy according to a sixth aspect is the one set forth in any one of the first to fifth aspects, wherein a concentration of oxygen contained is 0.0020% or less by mass.

The lead-free solder alloy according to a seventh aspect is the one set forth in any one of the first to sixth aspects, further containing any one or both of 0.0005 to 0.0050% by mass of Cr and 0.0005 to 0.0050% by mass of V.

The lead-free solder alloy according to an eighth aspect is the one set forth in any one of the first to seventh aspects, further containing 0.01 to 0.5% by mass of Sb.

The lead-free solder alloy according to a ninth aspect is the one set forth in any one of the first to eighth aspects, further containing any one or both of 0.0005 to 0.005% by mass of P and 0.0005 to 0.01% by mass of Ge, wherein P+Ge is 0.01% or less by mass.

A solder ball according to a tenth aspect comprises said lead-free solder alloy set forth in any one of the first to ninth aspects.

The solder ball according to an eleventh aspect is the one set forth in the tenth aspects, wherein a diameter of said ball is 300 μm or less.

An electronic member according to a twelfth aspect includes a solder bump formed by using said lead-free solder alloy according to any one of the first to ninth aspects.

The electronic member according to a thirteenth aspect is the one set forth in the twelfth aspect, wherein said solder bump is formed on a Cu electrode, a Ni electrode or a Cu/Ni/Au-plated substrate.

An electronic member according to a fourteenth aspect comprises a plurality of electronic components connected by solder electrodes, wherein part of or all of said solder electrodes are formed by using said lead-free solder alloy according to any one of the first to ninth aspects.

A lead-free solder alloy for use as an automobile-mounted electronic member according to a fifteenth aspect comprises said lead-free solder alloy according to any one of the first, second, third and fifth to ninth aspects.

A lead-free solder alloy for use as an automobile-mounted electronic member according to a sixteenth aspect comprises said lead-free solder alloy according to any one of the first to third aspects, wherein said lead-free solder alloy further contains 0.005 to 0.10% by mass of Co.

The lead-free solder alloy for use as an automobile-mounted electronic member according to a seventeenth aspect is the one set forth in the sixteenth aspect, wherein a total content of Ni, Co and Fe is 0.10% or less by mass.

The lead-free solder alloy for use as an automobile-mounted electronic member according to an eighteenth aspect is the one set forth in the sixteenth or seventeenth aspect, wherein concentration of oxygen contained is 0.0020% or less by mass.

The lead-free solder alloy for use as an automobile-mounted electronic member according to a nineteenth aspect is the one set forth in any one of the sixteenth to eighteenth aspects, further containing any one or both of 0.0005 to 0.0050% by mass of Cr and 0.0005 to 0.0050% by mass of V.

The lead-free solder alloy for use as an automobile-mounted electronic member according to a twentieth aspect is the one set forth in any one of the sixteenth to eighteenth aspects, further containing 0.01 to 0.5% by mass of Sb.

The lead-free solder alloy for use as an automobile-mounted electronic member according to a twenty-first aspect is the one set forth in any one of the sixteenth to twentieth aspects, further containing any one or both of 0.0005 to 0.005% by mass of P and 0.0005 to 0.01% by mass of Ge, wherein P+Ge is 0.01% or less by mass.

A solder ball for use as an automobile-mounted electronic member according to a twenty-second aspect comprises said lead-free solder alloy for an automobile-mounted electronic member according any one of the fifteenth to twenty-first aspects The lead-free solder alloy for use as an automobile-mounted electronic member according to a twenty-third aspect is the one set forth in the twenty-second aspect, wherein a diameter of said ball is 300 μm or less.

An automobile-mounted electronic member according to a twenty-fourth aspect comprises a solder bump formed by using said lead-free solder alloy for automobile-mounted electronic member according to any one of the fifteenth to twenty-first aspects.

The automobile-mounted electronic member according to a twenty-fifth aspect is the one set forth in the twenty-fourth aspect, wherein said solder bump is formed on a Cu electrode, a Ni electrode or a Cu/Ni/Au-plated substrate.

An automobile-mounted electronic member according to a twenty-sixth aspect comprises a plurality of electronic components joined together by solder electrodes, wherein part of or all of said solder electrodes are formed by using said lead-free solder alloy for an automobile-mounted electronic member according to any one of the fifteenth to twenty-first aspects.

An electronic member according to a twenty-seventh aspect comprises a plurality of electronic components joined together by solder electrodes, wherein part of or all of said solder electrodes are formed by using said lead-free solder alloy for an automobile-mounted electronic member according to any one of the fifteenth to twenty-first aspects, said electronic member being mounted on an automobile.

EFFECTS OF THE INVENTION

According to the present invention, the occurrence of fractures between intermetallic compound layers formed in an interface between an electrode and a solder alloy can be prevented by allowing the Sn—Ag—Cu-based lead-free solder alloy containing 1.0 to 2.0% by mass of Ag and 0.3 to 1.0% by mass of Cu to contain 0.005 to 0.10% by mass of Ni. Accordingly, the present invention can substantially improve the impact resistance of a solder joint formed by using a lead-free solder alloy.

Further, by adopting the foregoing compositions, the present invention can increase the fatigue strength of a solder alloy itself and that of intermetallic compound layers formed in an interface between an electrode and the solder alloy at the same time. Accordingly, the present invention realizes the substantial improvement of the vibration resistance of a solder joint formed by using the lead-free solder alloy and the eventual vibration resistance of automobile-mounted electronic members.

BEST MODE FOR CARRYING OUT THE INVENTION (1) First Embodiment

In the present invention, it has been found out that the impact resistance of a solder joint formed by using the lead-free solder alloy can be substantially improved by allowing an Sn—Ag—Cu-based lead-free solder alloy containing 1.0 to 2.0% by mass of Ag and 0.3 to 1.0% by mass of Cu to contain 0.005 to 0.10% by mass of Ni. Hereunder will be discussed in detail concerning a speculative theory on why impact resistance is substantially improved by allowing a solder alloy to contain Ni.

When forming a joint on a Cu electrode, using the Sn—Ag—Cu-based lead-free solder alloy, a $Cu_3Sn$ intermetallic compound layer is formed directly on the Cu electrode and then a $Cu_6Sn_5$ intermetallic compound layer is formed thereon and finally a solder alloy layer is formed thereon. When forming a joint on a typical Cu/Ni/Au-plated substrate, using the Sn—Ag—Cu-based lead-free solder alloy, a $Ni_3Sn_4$ intermetallic compound layer is formed on a Ni electrode and then a $Cu_6Sn_5$ intermetallic compound layer is formed thereon and finally the solder alloy layer is formed thereon.

As discussed above, a test for evaluating the impact resistance of a solder bump formed on these electrodes reveals that, with respect to a solder bump on the Cu electrode, fractures occur in an interface between the $Cu_3Sn$ intermetallic compound and the $Cu_6Sn_5$ intermetallic compound, while, with respect to the solder bump on the Cu/Ni/Au-plated board, fractures occur in an interface between the $Ni_3Sn_4$ intermetallic compound and the $Cu_6Sn_5$ intermetallic compound. In either case, fractures occur between the intermetallic compound layers formed in two layers.

In the present invention, it has been found out that a strain between the $Cu_6Sn_5$ intermetallic compound layers is a main cause of the fracture, and that the reduction of the strains between the $Cu_6Sn_5$ intermetallic compound layers enables the occurrence of the fracture between the intermetallic compound layers formed in two layers to be restrained so that the impact resistance of a solder joint can be improved.

When checking for a stress formation near the electrode soldered, it was found that compressive stress occurred in the $Cu_3Sn$ intermetallic compound in the case of the Cu electrode (or in the $Ni_3Sn_4$ intermetallic compound in the case of a Ni electrode), while tensile stress occurred between the $Cu_6Sn_5$ intermetallic compound layers thereon. Accordingly, it is understood that the strains in the $Cu_6Sn_5$ intermetallic compound layers can be reduced by replacing a Cu atom site in the $Cu_6Sn_5$ intermetallic compound layer by an atom with a smaller radius than that of the Cu atom. Ni corresponds to such atom that has the smaller radius than that of the Cu atom.

As discussed above, when a solder joint is formed on the Cu electrode by using the Sn—Ag—Cu-based lead-free solder alloy, the $Cu_3Sn$ intermetallic compound layer is formed directly on the Cu electrode and then the $Cu_6Sn_5$ intermetallic compound layer is formed thereon. Then, the $Cu_6Sn_5$ intermetallic compound is studied in detail. In the case that a 3d transition metal element Ni is contained in a solder alloy, Ni is contained in the intermetallic compound in a manner replacing Cu of the $Cu_6Sn_5$ intermetallic compound.

Ni has a comparatively small atomic radius compared to that of Cu. Accordingly, when Cu of the $Cu_6Sn_5$ intermetallic compound is replaced by Ni, an average lattice constant of the $Cu_6Sn_5$ intermetallic compound becomes comparatively small as compared to the case where Cu is not replaced. Hence, the intermetallic compound shrinks to reduce the compression stress that had been applied to the $Cu_6Sn_5$ intermetallic compound, thus resulting in the reduction of the strains between adjacent $Cu_6Sn_5$ intermetallic compound layers.

In order to verify that the above-mentioned holds true, replacement by the 3d transition metal element in the $Cu_6Sn_5$ phase was analyzed according to the first-principles calculation. When the specific Cu site in the $Cu_6Sn_5$ phase was replaced by the 3d transition metal element, an average distance between the substituted element and adjacent Cu, Sn atoms was calculated according to the first-principles calculation. Results show that when the substituted element is Ni, the distance between a Ni atom and the adjacent Cu atom is increased by replacing Cu, while the distance between the Ni atom and the adjacent Sn atom is decreased. This holds true for the case where the substituted element is Cr or V.

In fact, comparing the way of growth of the intermetallic compound layers with respect to the Sn—Ag—Cu-based lead-free solder alloys, it was found that the $Cu_6Sn_5$ intermetallic compound layer grew large and nonuniform when Ni was not added, whereas the $Cu_6Sn_5$ intermetallic compound layer grew thin and uniform when Ni was added. Thus, it can be considered that such morphological change in the intermetallic compound layers also makes contribution to the effective prevention of the fractures originated from the intermetallic compound layer.

The reason why the impact resistance is substantially improved when containing Ni in the solder alloy is estimated to be due to the above mechanism.

Net is a description of a reason why the content of each alloy element should be limited in the solder alloy.

Ag: If the Ag content is excessive in the Sn—Ag—Cu-based lead-free solder alloy, then the $Ag_3Sn$ intermetallic compound is precipitated too much and thus the solder alloy becomes brittle or too hard, thus resulting in the deterioration of the drop-impact resistance. If the Ag content is 2.0% or less by mass, excellent drop-impact resistance can be ensured. On the other hand, if the Ag content is too low, a liquidus-line temperature of the solder alloy is increased. If the Ag content is not less than 1.0% by mass, the liquidus-line temperature of the solder alloy that is sufficiently low can be ensured. For example, if the Ag content is 1.0% by mass in the case where the Cu content is 0.5% by mass, 227 deg C. can be ensured as the liquidus-line temperature.

Cu: If the Cu content is too low in the Sn—Ag—Cu-based lead-free solder alloy, then the liquidus-line temperature of the solder alloy is increased. If the Cu content is not less than 0.3% by mass, the liquidus-line temperature of the solder alloy can be controlled not to rise above 227 deg C. On the other hand, if the Cu content is too high, the Vickers hardness of the solder alloy is increased, and thus it is not desirable. If the Cu content is not more than 1.0% by mass, the Vickers hardness can be controlled not to increase more than 10% in hardness when the Ag content is 1.5% by mass, for example.

Ni: In the present invention, Ni is a primary element to be contained for improving the impact resistance of the solder alloy. If the Ni content is not less than 0.005% by mass, the strain in the intermetallic compound can be reduced by Ni, thus being capable of achieving the improving effect to the impact resistance, as discussed above. More preferably, the Ni content is not less than 0.04% by mass.

Heretofore, when conventional Sn—Ag—Cu solder balls are reflowed on the Cu electrode, Cu in the electrode diffuses into the solder alloy to thereby harden the solder bump. On the other hand, when the solder alloy containing the minute amount of Ni content is used as in the present invention, Ni is precipitated near the Cu electrode to be taken in the intermetallic compound, thus functioning to keep Cu from diffusing. Accordingly, the solder bump reflowed on the Cu electrode using the solder alloy of the present invention is soft by itself and thus the drop-impact resistance is further improved. If the Ni content contained in the solder bump is excessive, however, behavior to harden the solder bump will appear.

In the case of forming a solder joint using a fused solder on an electrode such as the Cu electrode or the like, the Ni content contained in the solder alloy is preferentially distributed into the intermetallic compound layer when the intermetallic compound layers are formed on the electrode. Due to such distribution, the Ni content in the solder alloy in a liquid phase is decreased as the solidification of the intermetallic compound layers proceeds, which is finally decreased to about 20 to 50% of the Ni content in the original solder alloy after the completion of the solidification. Thus, as a result of the decrease in the Ni content in the solder alloy, the hardness of the solder alloy itself is decreased. Consequently, the solder alloy can absorb collision energy at the time of the application of drop impact to thereby make substantial contribution to the improvement in the drop-impact resistance. When the Ni content in the solder alloy in the present invention prior to reflowing exceeds 0.07% by mass, a residual Ni content in the solder alloy after reflowing becomes excessive to thereby harden the solder alloy. Hence, the present invention proposes to set an upper-limit of the Ni content to 0.10% by mass in order to improve the drop-impact resistance, and at the same time, proposes to set an upper-limit of the Ni content to 0.07% by mass in order to keep a change in hardness in a good condition before and after reflowing. Further, if the Ni content exceeds 0.12% by mass, an advertise effect occurs that the liquidus-line temperature becomes too high.

The solder alloy disclosed in the patent document 2 is aimed at improving the drop-impact resistance, and this prior art teaches that Ni may be further contained as a selectable element. The solder alloy described in the patent document 2, however, is aimed at improving the strength of the solder alloy by adding Ni thereto. As described in the patent document 2, however, the fact is that the increase in strength of the solder alloy has the opposite effect to the impact resistance. Besides, the Ni content in the embodiment of the patent document 2 is 0.3% or more by mass and such high Ni content cannot realize the excellent impact resistance of the present invention.

Next is a description of components that may be preferably selected.

O: A solder alloy contains oxygen as an impurity. When the concentration of oxygen exceeds 0.0020% by mass, the drop-impact resistance is decreased in association with the rise of the concentration of oxygen. In the present invention, therefore, the concentration of contained oxygen is desirably not more than 0.0020% by mass.

As discussed above, Ni is effective as a 3d transition metal element for improving the impact resistance in the present invention. Also, when Cr or V is further added in addition to Ni, the same effect for improving the impact resistance can be obtained.

Cr: Cr can work well for improving the impact resistance if the Cr content is 0.0005% or more by mass. On the other hand, if the Cr content is excessive, there occur the problems, such as the deterioration of solder property after reflowing, degraded solderability of the solder alloy, and abrupt rise of a melting point of the solder alloy. If the Cr content, however, is not more than 0.0050% by mass, the effect of improving the impact resistance can be produced without giving rise to these problems.

V: V can work well for improving the impact resistance if the V content is 0.0005% or more by mass. On the other hand, if the V content is excessive, the same problems as those discussed about the excessive Cr content occur. If the V content, however, is not more than 0.0050% by mass, the effect of improving the impact resistance can be produced without giving rise to those problems.

Sb: When Sb is contained in a solder alloy, Sb disperses within Sn dendrites serving as a parent phase, thereby enabling a thermal fatigue resistance in a thermal cycle test or the like of lead-free solders to be improved. When the Sb content is 0.001% or more by mass, it can improve such thermal cycle fatigue resistance. On the other hand, when the Sb content exceeds 0.5% by mass, the solder alloy is hardened and hence the drop-impact resistance is degraded. Accordingly, the upper limit of the Sb content is set to 0.5% by mass.

P and Ge: When any one of or both of P and Ge is/are added to the lead-free solder alloy, a color change on a surface of the solder alloy can be controlled. When the both elements are each contained in an amount of 0.0005% or more by mass, such color change controlling effect can be obtained. On the other hand, if the P or Ge content is excessive, the drop-impact resistance drops, whereas if the P content is not more than 0.005% by mass and the Ge content is not more than 0.01% by mass, then excellent drop-impact resistance can be maintained.

In a case where both P and Ge are to be contained, P+Ge may preferably be, in total amount, not more than 0.01% by mass since the drop-impact resistance can be maintained well within that range.

Preferably, a solder ball may be formed, using the lead-free solder alloy containing the above-mentioned components. The solder balls according to the present invention are allowed to adhere to a plurality of electrodes on electronic members such as semiconductor substrates, electronic components, printed-wiring boards or the like, using adhesive forces of flux, and then the electronic members are heated to high temperature to reflow the solder balls, thereby forming solder bumps on the electrodes. The semiconductor substrate or the like and the printed-wiring boards or the like are connected together via these solder bumps. The solder joints formed by the solder alloy thus way can achieve extremely excellent impact resistance.

The solder ball according to the present invention may preferably be not more than 300 micron in diameter. The smaller the diameter of a solder ball, the smaller the cross-sectional joint area of a solder joint formed using the solder ball becomes, and thus the drop-impact resistance becomes difficult to ensure. For this reason, the smaller the diameter of the solder ball is, the more improvement effect in drop-impact resistance can be exhibited according to the present invention. This is due to the fact that the drop-impact resistance improvement effect by the present invention can be fully exerted upon the solder ball with a diameter not more than 300 micron.

It is preferable to form an electronic member with a solder bump using the lead-free solder alloy containing the foregoing components. Semiconductor substrates or the like and printed-wiring boards or the like are joined together via the solder bumps. The joints formed by using the solder alloys thus formed can achieve extremely excellent impact resistance.

Preferably, in the electronic member with the solder bump according to the present invention, the solder bump may be formed on the Cu electrode, Ni electrode or the Cu/Ni/Au-plated substrate. This is due to the fact that the effect of the improvement in the impact resistance can be exerted on the joints between the lead-free solder alloy and the Cu electrode, the Ni electrode or the Cu/Ni/Au-plated substrate.

According to the electronic member according to the present invention, having a plurality of electronic components connected with one another by solder electrodes, in which the lead-free solder alloy of the present invention is used for part of or all of the solder electrodes, it is possible for such solder electrode(s) to exhibit extremely excellent impact resistance.

As discussed above, in the solder bump and the solder electrode that are formed using the lead-free solder according to the present invention, the Ni content in the solder alloy is preferentially distributed into the intermetallic compound at the time of joining, so that the Ni content distributed into a solder metallic portion gets less than the original Ni content in the solder alloy.

(2) Second Embodiment

In the present invention, it has been found that impact resistance of a joint formed using the lead-free solder alloy can be substantially improved by containing 0.005 to 0.1% by mass of Ni, 0.0001 to 0.005% by mass of Fe and further 0.005 to 0.1% by mass of Co in an Sn—Ag—Cu-based lead-free solder alloy containing 1.0 to 2.0% by mass of Ag and 0.3 to 1.0% by mass of Cu. The speculative theory on what causes the impact resistance of the joints formed using the lead-free solder alloy to be substantially improved by containing a minute amount of Fe, together with those of Ni and Co, in a solder alloy is as described in the first embodiment and hence only a simple explanation will be given hereinafter.

As discussed above, when a solder joint by the Sn—Ag—Cu-based lead-free solder is formed on a Cu electrode, a $Cu_3Sn$ intermetallic compound layer is formed directly on the Cu electrode and then a $Cu_6Sn_5$ intermetallic compound layer is formed thereon. Then, the $Cu_6Sn_5$ intermetallic compound will be discussed in detail. When 3d transition metal elements such as Ni, Co, Fe or the like are contained in a solder alloy, these 3d transition metal elements are contained therein in a manner replacing Cu in the $Cu_6Sn_5$ intermetallic compound.

All of Ni, Co and Fe have a small atomic radius as compared to that of Cu. Accordingly, when Cu in the $Cu_6Sn_5$ intermetallic compound is replaced by Ni, Co, Fe, an average lattice constant becomes comparatively small in comparison to the case where Cu is not replaced. Accordingly, the intermetallic compound shrinks to reduce the compression stress that had been applied to the $Cu_6Sn_5$ intermetallic compound, thus resulting in the reduction of the strains between adjacent $Cu_6Sn_5$ intermetallic compound layers.

In order to verify this mechanism, replacement by the 3d transition metal elements in the $Cu_6Sn_5$ phase was analyzed according to the first-principles calculation.

When the specific Cu site in the $Cu_6Sn_5$ phase was replaced by the 3d transition metal element, an average distance between the substituted element and adjacent Cu, Sn atoms was calculated according to the first-principles calculation. Results show that when the substituted element is any one of Ni, Co and Fe, the distance between the element's atom and the adjacent Cu atom is increased by replacing Cu, while the distance between the element's atom and the adjacent Sn atom is decreased. This holds true for the case where the substituted element is Mn, Cr or V.

The $Cu_6Sn_5$ intermetallic compound belongs to a hexagonal crystal system and there exist four Cu sites in the crystal. Here, these sites are referred to as Cu1, Cu2, Cu3, Cu'. Then, differences between substitution energies required to replace the respective four Cu sites by Ni, Co and Fe and substitution energies required to replace them in Sn with Ni, Co and Fe being in liquid-phase Sn, were evaluated. As a result, it was ascertained that although the Cu' site is most stable relative to all of the elements Ni, Co and Fe, Ni has a smaller intersite energy difference, and that Fe and Co more easily enter into each Cu site than does Ni, particularly into the Cu' site. Accordingly, it is estimated that in the case where Ni and Fe coexist in the solder alloy or where Ni, Co and Fe coexist therein, either Fe or both Co and Fe preferentially replaces the Cu' site in the $Cu_6Sn_5$ intermetallic compound while Ni rather replaces other sites.

When the Cu site of the $Cu_6Sn_5$ intermetallic compound is replaced by other transition element, diffusion can be inhibited. When only a specific site such as the Cu' is preferentially replaced by Co or Fe, the diffusion in a specific direction is hard to inhibit, whilst when any other site is also replaced by Ni, diffusion is inhibited in an isotropic manner, and hence the growth of an alloy phase can be further controlled. In other words, when both Ni and Fe or all of Ni, Co and Fe coexist in the Sn—Ag—Cu-based solder alloy, an advantageous effect of suppressing the growth of the $Cu_6Sn_5$ intermetallic compound layer can be expected.

Further, by containing a small amount of Fe in the Sn—Ag—Cu-based solder alloy, a large amount of $FeSn_2$ intermetallic compound is produced during the cooling of a fused solder, which is then allowed to act as a core of an initial crystal, thereby making a dendrite structure microscopic. Crystals are formed from between initial crystalline dendrites in the subsequent thermal process, so that a less uneven intermetallic compound layer is formed in a material produced by making the dendrite structure microscopic by adding a minute amount of Fe. If the Fe content is excessive, however, the intermetallic compound layer becomes coarse to bring about an adverse effect.

In fact, comparing the way of growth of the intermetallic compound layers with respect to the Sn—Ag—Cu-based solder alloy, it has been found that when adding none of Ni, Co and Fe, the $Cu_6Sn_5$ intermetallic compound layer grows large and nonuniform, whereas when adding both Ni and Fe or all of Ni, Co and Fe, then the $Cu_6Sn_5$ intermetallic compound layer gets thin and grows uniform. Crack generation originated from between the intermetallic compound layers can be considered to be effectively prevented by such a morphological change in the intermetallic compound layers as well.

The reason why the impact resistance could be substantially improved by containing the a minute amount of Fe in the solder alloy in addition to Ni, Co is possibly explained by the mechanism described above.

Next is an explanation of the reason why the content of each alloy element in the solder alloy should be limited. In the meantime, the description of the components that are the same as in the first embodiment are omitted for the simplicity.

Ag: Preferably, the Ag content may be in a ranger of from 1.1 to 1.5% by mass, specifically close to 1.2% by mass, as the drop-impact resistance is particularly improved in that range.

Ni: In the present invention, Ni, along with Fe, is a primary component for improving the impact resistance of the solder alloy. If the Ni content is not less than 0.005% by mass, the foregoing impact resistance improvement effect can be realized. The Ni content is more preferably not less than 0.03% by mass. On the other hand, if the Ni content exceeds 0.10% by mass, the melting point of the solder alloy rises and thus it is undesirable. Further, if the Ni content is increased, hardness of the solder alloy increases and thus it is undesirable from a standpoint of the impact resistance. If the Ni content is not more than 0.06% by mass, the hardness of the solder alloy is sufficiently low and thus it is desirable. The Ni content is more preferably not more than 0.05% by mass.

Fe: According to the present invention, containing a minute amount of Fe enables a breakthrough improvement in the impact resistance through the synergistic effect with the above-mentioned Ni. If the Fe content is not less than 0.0001% by mass, the improvement effect in the impact resistance according to the present invention can be realized. The Fe content is preferably not less than 0.0005% by mass. If the Fe content exceeds 0.005% by mass, there will occur some problems including degradation in surface condition such that a solder alloy surface after reflowing becomes rough and coarse as well as decrease in solderabilty. As discussed above, an excessive Fe content makes the $FeSn_2$ intermetallic compound layer coarse to give rise to the opposite effect, while the Fe content not more than 0.005% by mass, however, does not give rise to such problem. Further, a high Fe content has a slight adverse effect on the drop-impact resistance, while the Fe content not more than 0.001% by mass causes no problem.

Hereunder is a description of preferably selected components. For simplicity, the descriptions of the components that are the same as those described in the first embodiment are omitted.

Co: According to the present invention, containing Co in a solder alloy enables even more excellent impact resistance to be obtained, as discussed above. If the Co content is not less than 0.005% by mass, the improvement effect in the impact resistance due to the Co content can be realized. On the other hand, if the Co content is excessive, there occur some problems that hardness of a solder alloy itself is increased so that the drop-impact resistance decreases and a melting point of the solder alloy is increased. If the Co content is not more than 0.10% by mass, there occurs no problem.

In the present invention, it is preferable that a total amount of the Ni, Co, Fe contents is not more than 0.10% by mass. Even if each of the Ni, Co, Fe contents is within the above-mentioned range of content discussed for each content, there still occur the problems that hardness of the solder alloy itself is increased so that the drop-impact resistance is decreased and a melting point of the solder alloy is increased if the total amount of the Ni, Co, Fe contents exceed 0.10% by mass.

Ag: Preferably, Ni, Co and Fe may be added to satisfy the proportional relationships: Ni:Co:Fe=10:3 to 7:0.02 to 2 in the solder alloy of the present invention, containing 1.0 to 2.0% by mass of Ag, 0.3 to 1.0% by mass of Cu, 0.005 to 0.10% by mass of Ni, 0.005 to 0.10% by mass of Co, 0.0001 to 0.005% by mass of Fe and the balance of Sn and unavoidable impurities. In the solder alloy of the present invention containing all of Ni, Co and Fe, strain in the $Cu_6Sn_5$ intermetallic compound layer is reduced by replacing the Cu atomic site of $Cu_6Sn_5$ by group 8 3d transition atoms such as Ni (atomic radius: 1.24 angstrom), Co (atomic radius: 1.25 angstrom) and Fe (atomic radius: 1.26 angstrom) each having a smaller atomic radius than Cu (atomic radius: 1.28 angstrom). At this moment, from a standpoint of atomic radius, the most effective element is Ni that has a large difference in atomic radius from that of Cu atom. However, an element which can most easily substitute for the Cu atomic site of $Cu_6Sn_5$ is Fe as discussed above. When a minute amount of Fe substitutes for the Cu atomic site, the Cu site is triggered by this substitution to be replaced by the Ni atom. Further, though the Co atom substitutes in $Cu_6Sn_5$ less efficiently than does the Fe atom, the Co atom has better substitution efficiency than the Ni atom. Part of the Cu atomic sites of $Cu_6Sn_5$ are replaced by Ni, and then the Cu atomic sites which cannot be replaced by Ni are replaced by Co. Thus way, the Cu atomic sites of $Cu_6Sn_5$ are replaced by Ni, Co and Fe as a whole, thus reducing the strains in the intermetallic compounds. Whilst the atom having the highest substitution efficiency is that of Ni, it was examined in what proportion the elements should be added that precipitate earlier than Ni and more easily substitute for $Cu_6Sn_5$. As a result, the inventors of the present invention have reached the findings that more excellent drop-impact resistance can be realized if the range of the ratio of the elements satisfies the following relationships: N:Co:Fe=10:3 to 7:0.02 to 2.

In the present invention proposing such range of the ratio as Ni:Co:Fe=10:3 to 7:0.02 to 2, the Ni content may preferably be not less than 0.02% by mass, more preferably not less than 0.03% by mass. Further, the Ni content may preferably be not more than 0.06% by mass, more preferably not more than 0.05% by mass. Most preferably, the Ni content may be in the order of 0.04% by mass.

In present invention, as a transition element for improving the impact resistance, Ni, Fe and Co are effective as discussed above. In the case where Cr, V, however, is/are added instead of Fe or together with Fe, there can be achieved the same impact resistance improvement effect as the above-mentioned.

Third Embodiment

In the present invention, it has been found that the impact resistance of a solder joint formed using the lead-free solder can be substantially improved by containing 0.005 to 0.1% by mass of Ni, 0.0001 to 0.005% by mass of Fe and 0.005 to 0.1% by mass of Co in the Sn—Ag—Cu-based lead-free solder for an automobile-mounted electronic member containing 1.0 to 2.0% by mass of Ag and 0.3 to 1.0% by mass of Cu. The speculative theory on what causes the impact resistance to be substantially improved by containing the a minute amount of Fe, together with Ni and Co, in the solder alloy is as described in the first and second embodiments and hence only a simple explanation will be given hereinafter.

In fact, comparing the way of growth of the intermetallic compound layers with respect to the Sn—Ag—Cu-based solder alloy, it has been found that when adding none of Ni, Co and Fe, the $Cu_6Sn_5$ intermetallic compound layer grows large and nonuniform, whereas when adding Ni, both Ni and Fe, both Co and Fe, or all of Ni, Co and Fe, then the $Cu_6Sn_5$ intermetallic compound layer gets thin and grows uniform. Crack generation originated from between the intermetallic compound layers can be considered to be effectively prevented by such a morphological change in the intermetallic compound layers as well.

When Ni, Co, Fe are contained in the solder alloy, they are largely preferentially distributed in an electrode interface as discussed above to thereby function to reduce the strains between the intermetallic compound layers so as to make the thickness thin uniformly. On the other hand, it has proven that fatigue strength of the solder alloy itself is improved by the residual Ni, Co and Fe that remain in minute amounts inside the solder. In other words, the minute contents of these elements enable not only the fatigue strength in the vicinity of the intermetallic compound layers but also that of the solder alloy to be improved at the same time.

The reason why the impact resistance has been substantially improved by containing Ni and Co, with the minute Fe content, in the solder alloy is estimated to be due to the foregoing mechanism.

Net is a description of the reason why the content of each alloy element should be limited in the solder alloy.

If the Ag content is excessive in the Sn—Ag—Cu-based lead-free solder alloy for automobile-mounted electronic members, then the $Ag_3Sn$ intermetallic compound is precipitated too much and thus the solder alloy becomes brittle or too hard, thus resulting in the deterioration of the vibration resistance. If the Ag content is 2.0% or less by mass, excellent vibration resistance can be ensured. On the other hand, if the Ag content is too low, a liquidus-line temperature of the solder alloy is increased. If the Ag content is not less than 1.0% by mass, the liquidus-line temperature of the solder alloy that is sufficiently low can be ensured. For example, if the Ag content is 1.0% by mass in the case where the Cu content is 0.5% by mass, 227 deg C. can be ensured as the liquidus-line temperature.

Cu: If the Cu content is too low in the Sn—Ag—Cu-based lead-free solder alloy for automobile-mounted electronic members, then the liquidus-line temperature of the solder alloy is increased. If the Cu content is not less than 0.3% by mass, the liquidus-line temperature of the solder alloy can be controlled not to rise above 227 deg C. On the other hand, if the Cu content is too high, the Vickers hardness of the solder alloy is increased, and thus it is not desirable. If the Cu content is not more than 1.0% by mass, the Vickers hardness can be controlled not to increase more than 10% in hardness when the Ag content is 1.5% by mass, for example.

Ni: In the present invention, Ni is a primary component for improving the impact resistance of the solder alloy. If the Ni content is not less than 0.005% by mass, the foregoing vibration resistance improvement effect can be realized. The Ni content is more preferably not less than 0.03% by mass. On the other hand, if the Ni content exceeds 0.10% by mass, the melting point of the solder alloy rises and thus it is undesirable. Further, if the Ni content is increased, hardness of the solder alloy increases and thus it is undesirable from a standpoint of the vibration resistance. If the Ni content is not more than 0.06% by mass, the hardness of the solder alloy is sufficiently low and thus it is desirable. The Ni content is more preferably not more than 0.05% by mass.

Hereunder is a description of preferably selected components.

Fe: According to the present invention, containing a minute amount of Fe enables a breakthrough improvement in the vibration resistance through the synergistic effect with the above-mentioned Ni. If the Fe content is not less than 0.0001% by mass, the improvement effect in the vibration resistance according to the present invention can be realized. The Fe content is more preferably not less than 0.0005% by mass. If the Fe content exceeds 0.005% by mass, there will occur some problems including degradation in surface condition such that a solder alloy surface after reflowing becomes rough and coarse as well as decrease in solderabilty. As discussed above, the excessive Fe content makes the $FeSn_2$ intermetallic compound layers coarse to give rise to the opposite effect, while the Fe content not more than 0.005% by mass does not give rise to such problem. Further, a high Fe content has a slight adverse effect on the vibration resistance, while the Fe content not more than 0.001% by mass causes no problem.

Co: According to the present invention, containing Co in the solder alloy enables even more excellent vibration resistance to be obtained, as discussed above. If the Co content is not less than 0.005% by mass, the improvement effect in the vibration resistance due to the Co content can be realized. On the other hand, if the Co content is excessive, there occur some problems that hardness of the solder alloy itself is increased so that the vibration resistance decreases and a melting point of the solder alloy is increased. If the Co content is not more than 0.10% by mass, such problem does not occur.

In the present invention, it is preferable that a total amount of the Ni, Co, Fe contents is not more than 0.10% by mass. Even if each of the Ni, Co, Fe contents is within the above-mentioned range of content discussed for each content, there still occur the problems that hardness of the solder alloy itself is increased so that the vibration resistance is decreased and a melting point of the solder alloy is increased if the total amount of the Ni, Co, Fe contents exceed 0.10% by mass.

In the case of forming the solder joint using the fused solder on an electrode such as the Cu electrode or the like, the Ni content or Co content contained in the solder alloy is preferentially distributed into the intermetallic compound layers when the intermetallic compound layers are formed on the electrode. Due to such distribution, the Ni or Co content in the solder alloy in a liquid phase is decreased as the solidification of the intermetallic compound layers proceeds, which is finally decreased to about 20 to 50% of the Ni or Co content in the original solder alloy after the completion of the solidification. Thus, as a result of the decrease in the Ni or Co content in the solder alloy, the hardness of the solder alloy itself is decreased. Consequently, the solder alloy can absorb impact energy at the time of the reverse bend test to thereby make substantial contribution to the improvement in the vibration resistance.

Ag: Preferably, Ni, Co and Fe may be added to satisfy the proportional relationships: Ni:Co:Fe=10:3 to 7:0.02 to 2 in the solder alloy of the present invention, containing 1.0 to 2.0% by mass of Ag, 0.3 to 1.0% by mass of Cu, 0.005 to 0.10% by mass of Ni, 0.005 to 0.10% by mass of Co, 0.0001 to 0.005% by mass of Fe and the balance of Sn and unavoidable impurities. In the solder alloy of the present invention containing all of Ni, Co and Fe, strain in the $Cu_6Sn_5$ intermetallic compound layer is reduced by replacing the Cu atomic site of $Cu_6Sn_5$ by group 8 3d transition atoms such as Ni (atomic radius: 1.24 angstrom), Co (atomic radius: 1.25 angstrom) and Fe (atomic radius: 1.26 angstrom) each having a smaller atomic radius than Cu (atomic radius: 1.28 angstrom). At this moment, from a standpoint of atomic radius, the most effective element is Ni that has a large difference in atomic radius from that of Cu atom. However, the element which can most easily substitute for the Cu atomic site of $Cu_6Sn_5$ is Fe as discussed above. When a minute amount of Fe substitutes for the Cu atomic site, the Cu site is triggered by this substitution to be replaced by the Ni atom. Further, though the Co atom substitutes in $Cu_6Sn_5$ less efficiently than does the Fe atom, the Co atom has better substitution efficiency than the Ni atom. Part of the Cu atomic sites of $Cu_6Sn_5$ are replaced by Ni, and then the Cu atomic sites which cannot be replaced by Ni are replaced by Co. Thus way, the Cu atomic sites of $Cu_6Sn_5$ are replaced by Ni, Co and Fe as a whole, thus reducing the strains in the intermetallic compounds. Whilst the atom having the highest substitution efficiency is that of Ni, it was examined in what proportion the elements should be added that precipitate earlier than Ni and more easily substitute for $Cu_6Sn_5$. As a result, the inventors of the present invention have reached the findings that more excellent vibration resistance can be realized if the range of the ratio of the elements satisfies the following relationships: N:Co:Fe=10:3 to 7:0.02 to 2.

In the present invention proposing such range of the ratio as Ni:Co:Fe=10:3 to 7:0.02 to 2, the Ni content may preferably be not less than 0.02% by mass, more preferably not less than 0.03% by mass. Further, the Ni content may preferably be not more than 0.06% by mass, more preferably not more than 0.05% by mass.

Preferably, the automobile-mounted electronic member according to the present invention may be the one having solder bumps using the lead-free solder alloy containing the foregoing components. Semiconductor substrates or the like and printed-wiring boards or the like are joined together via the solder bumps. The solder joints formed by the solder alloys thus formed can achieve extremely excellent vibration resistance, so that the joints can be suitably used for the automobile-mounted electronic members.

It is preferable that in the automobile-mounted electronic member with the solder bumps according to the present invention, the solder bumps are formed on a Cu electrode, a Ni electrode or a Cu/Ni/Au-plated substrate, as the present invention has the vibration resistance improvement effect upon the joints between the lead-free solder alloy and the Cu electrode, the Ni electrode or the Cu/Ni/Au-plated substrate.

According to the electronic member of the present invention where a plurality of electronic components are connected with one another by solder electrodes either part of or all of which are formed by using the lead-free solder alloy according to the present invention to thereby provide the automobile-mounted electronic member, the solder electrodes can exhibit extremely excellent vibration resistance. Accordingly, the electronic member can be suitably used as the automobile-mounted electronic member.

According to the automobile-mounted electronic member comprising the electronic member of the present invention where a plurality of electronic components are connected with one another by solder electrodes either part of or all of which are formed by using the lead-free solder alloy according to the present invention, the solder electrodes can exhibit extremely excellent vibration resistance, and thus the electronic member can fully withstand the vibrations which the automobile is subjected to during the travel.

As discussed above, in the solder bump and the solder electrode which are formed by using the lead-free solder according to the present invention, the Ni, Co contents in the solder alloy are preferentially distributed into the intermetallic compounds at the time of joining, so that the Ni, Co contents distributed into the solder metal portion become less than the original Ni, Co contents in the solder alloy.

2. Examples (1) Examples of the First Embodiment

Using solder alloys comprised of the respective contents shown in Tables 1 to 4, solder balls having a diameter of 300 μm were prepared.

As a substrate having an electrode joined to the solder ball, an FR-4 printed-wiring board was used. The printed-wiring board was 160 by 64 mm in size, having 0.8 mm thickness. 324 electrodes having a diameter of 240 μm were arranged on the printed-wiring board. As the electrodes, two types of the electrodes were used: the one using Cu—OSP and the other using Ni (3 to 5 μm plated)/Au (0.03 to 0.05 μm plated). A silicon chip of 9.6 mm square and 0.7 mm thickness was used as a surface-mounted component joined to the above-mentioned printed-wiring board via the solder balls. 324 electrodes having a diameter of 240 μm were arranged on the silicon chip in the positions corresponding to the electrodes on the printed-wiring board. The material of the electrode was comprised of Cr (0.07 μm)/Ni (0.8 μm)/Au (0.1 μm). It was designed such that the circuit connecting the respective electrodes in series was formed when the electrodes of the printed-wiring board and those of the silicon chip were joined together through the solder joints.

As a mounting process, the solder balls were first mounted on the electrodes on the above-mentioned silicon chip side and then allowed to undergo a reflow process to form solder bumps. Then, the silicon chip on which the solder bumps were formed was flip-chip bonded to the printed-wiring board and allowed to undergo a reflow process at a peak temperature of 250 deg C. to join the electrodes of the silicon chip to those of the printed-wiring board, and thus an evaluation member was formed.

A drop-impact resistance was evaluated by using a fully automatic impact testing machine BIT-600S produced by T-Tec corporation. The evaluation member joined as above was placed on a surface plate with the silicon chip side down. Next, a rod type probe of 30 g by mass was made to drop from a height of 5 cm on the evaluation member. The impact acceleration applied to the evaluation member was monitored by an acceleration sensor (produced by TEAC Company). The impact acceleration on the evaluation member was in the range of 8,000 G to 12,000 G.

For the evaluation of fracture, the above-mentioned circuit in the evaluation member was connected to a constant current power supply to monitor the voltage, and the number of drops carried out repeatedly until the resistance value became twice as high as the initial value was defined as the drop-impact resistant drop count. Then, a measuring instrument having a sampling rate of 1 MHz was used for recognition of an instantaneous fracture caused by the deflection of the dropping substrate as fracture.

For evaluation of the drop-impact resistance of the substrate using the Cu—OSP electrode, if the number of drops carried out repeatedly until the occurrence of fracture was in a range of 0 to 30, then it was rated as x; if in a range of 31 to 60, then rated as Δ; if in a range of 61 to 80, then rated as ○; and if 81 or more, then rated as ◎. On the other hand, for the substrate using the Ni/Au electrode, if the number of drops carried out repeatedly until the occurrence of fracture was in a range of 0 to 10, then it was rated as x; if in a range of 11 to 20, then rated as Δ; if in a range of 21 to 40, then rated as ○; and if 41 or more, then rated as ◎, respectively.

The softer a post-reflow solder alloy becomes, the more the drop-impact resistance of a solder joint is improved. On the other hand, when a solder is reflowed on the Cu electrode, the solder gets hardened if the Cu of the electrode diffuses into the solder. Further, if the Ni content in the solder alloy is too high, the residual Ni hardens the solder. Thus, the Cu—OSP electrode was allowed to undergo a reflow process with the solder balls mounted thereon, and then the change in hardness of the solder alloy before and after reflowing was evaluated. If the difference in Vickers hardness before and after reflowing was less than 40%, then it was rated as ○, while if it was 40% or more, it was rated as x.

Using the same surface-mounted component (Cu—OSP electrode) as the one for testing the drop-impact resistance, thermal fatigue resistance was evaluated by measuring the number of repetitions (number of thermal cycles) of a high-temperature step and a low-temperature step that were carried out by holding the component at −40 deg C. for 20 minutes and then holding the same at 125 deg C. for 20 minutes and continued until the fracture of the circuit occurred. If the number of repetitions at which the fracture started to occur was 1000 or more, then it was rated as ○, while if 750 or more, then it was rated as Δ, and if 500 or less, it was rated as x.

The evaluation of color change was carried out in such a manner that the prepared solder balls for evaluation were put on a porcelain square plate and held at 150 deg C. for 200 hours in the atmosphere, and then a sensory test with naked-eye was carried out to compare with a sample in an initial condition. When there was no change observed, it was rated as ○. The solder ball of Sn-3.0Ag-0.5Cu which showed the greatest change was rated as x, and the one which showed the intermediary color change was rated as Δ.

In Tables 1 to 4, component values out of the scope of the present invention are underlined.

TABLE 1

| | Content (% by Mass) | | | | Hardness Change before and after Reflowing (Cu—OSP Substrate) | Drop-Impact Resistance | | Other Degraded Property |
| --- | --- | --- | --- | --- | --- | --- | --- | --- |
| | Sn | Ag | Cu | Ni | | Cu—OSP Electrode | Ni/Au Electrode | |
| C.E. 1 | The Balance | 1.0 | 0.3 | 0.003 | ○ | X | X | |
| E. 1 | The Balance | 1.0 | 0.3 | 0.005 | ○ | Δ | Δ | |
| E. 2 | The Balance | 1.0 | 0.3 | 0.040 | ○ | ◎ | ○ | |
| E. 3 | The Balance | 1.0 | 0.3 | 0.050 | ○ | ◎ | ◎ | |
| E. 4 | The Balance | 1.0 | 0.3 | 0.060 | ○ | ◎ | ○ | |
| E. 5 | The Balance | 1.0 | 0.3 | 0.070 | ○ | ◎ | ○ | |
| E. 6 | The Balance | 1.0 | 0.3 | 0.100 | X | Δ | Δ | |
| C.E. 2 | The Balance | 1.0 | 0.3 | 0.120 | X | X | X | Liquidus-Line Temperature |
| C.E. 3 | The Balance | 1.0 | 1.0 | 0.003 | ○ | X | X | |
| E. 7 | The Balance | 1.0 | 1.0 | 0.005 | ○ | Δ | Δ | |
| E. 8 | The Balance | 1.0 | 1.0 | 0.050 | ○ | ◎ | ○ | |
| E. 9 | The Balance | 1.0 | 1.0 | 0.070 | ○ | Δ | Δ | |
| E. 10 | The Balance | 1.0 | 1.0 | 0.100 | X | Δ | Δ | |
| C.E. 4 | The Balance | 1.0 | 1.0 | 0.120 | X | X | X | Liquidus-Line Temperature |
| C.E. 5 | The Balance | 2.0 | 0.3 | 0.003 | ○ | X | X | |
| E. 11 | The Balance | 2.0 | 0.3 | 0.005 | ○ | Δ | ○ | |
| E. 12 | The Balance | 2.0 | 0.3 | 0.050 | ○ | ○ | ○ | |
| E. 13 | The Balance | 2.0 | 0.3 | 0.070 | ○ | ○ | Δ | |
| E. 14 | The Balance | 2.0 | 0.3 | 0.100 | X | Δ | Δ | |
| C.E. 6 | The Balance | 2.0 | 0.3 | 0.120 | X | X | X | Liquidus-Line Temperature |
| C.E. 7 | The Balance | 2.0 | 1.0 | 0.003 | ○ | X | X | |

TABLE 1-continued

| | Content (% by Mass) | | | | Hardness Change before and after Reflowing (Cu—OSP Substrate) | Drop-Impact Resistance | | Other |
| --- | --- | --- | --- | --- | --- | --- | --- | --- |
| | Sn | Ag | Cu | Ni | | Cu—OSP Electrode | Ni/Au Electrode | Degraded Property |
| E. 15 | The Balance | 2.0 | 1.0 | 0.005 | ○ | Δ | Δ | |
| E. 16 | The Balance | 2.0 | 1.0 | 0.050 | ○ | ○ | ○ | |
| E. 17 | The Balance | 2.0 | 1.0 | 0.070 | ○ | Δ | Δ | |
| E. 18 | The Balance | 2.0 | 1.0 | 0.100 | X | Δ | Δ | |
| C.E. 8 | The Balance | 2.0 | 1.0 | 0.120 | X | X | X | Liquidus-Line Temperature |

C.E.: Comparative Example
E.: Example

TABLE 2

| | Content (% by Mass) | | | | Hardness Change before and after Reflowing (Cu—OSP Substrate) | Drop-Impact Resistance | | Other |
| --- | --- | --- | --- | --- | --- | --- | --- | --- |
| | Sn | Ag | Cu | Ni | | Cu—OSP Electrode | Ni/Au Electrode | Degraded Property |
| C.E. 9 | The Balance | 1.2 | 0.5 | 0.003 | ○ | X | X | |
| E. 19 | The Balance | 1.2 | 0.5 | 0.005 | ○ | Δ | Δ | |
| E. 20 | The Balance | 1.2 | 0.5 | 0.030 | ○ | ○ | ○ | |
| E. 21 | The Balance | 1.2 | 0.5 | 0.040 | ○ | ◎ | ○ | |
| E. 22 | The Balance | 1.2 | 0.5 | 0.050 | ○ | ◎ | ◎ | |
| E. 23 | The Balance | 1.2 | 0.5 | 0.060 | ○ | ◎ | ○ | |
| E. 24 | The Balance | 1.2 | 0.5 | 0.070 | ○ | ○ | Δ | |
| E. 25 | The Balance | 1.2 | 0.5 | 0.100 | X | Δ | Δ | |
| C.E. 10 | The Balance | 1.2 | 0.5 | 0.120 | X | X | X | Liquidus-Line Temperature |
| C.E. 11 | The Balance | 1.0 | 0.65 | 0.003 | ○ | X | X | |
| E. 26 | The Balance | 1.0 | 0.65 | 0.005 | ○ | Δ | Δ | |
| E. 27 | The Balance | 1.0 | 0.65 | 0.040 | ○ | ◎ | ○ | |
| E. 28 | The Balance | 1.0 | 0.65 | 0.050 | ○ | ◎ | ◎ | |
| E. 29 | The Balance | 1.0 | 0.65 | 0.060 | ○ | ○ | ○ | |
| E. 30 | The Balance | 1.0 | 0.65 | 0.070 | ○ | ○ | ○ | |
| E. 31 | The Balance | 1.0 | 0.65 | 0.100 | X | Δ | Δ | |
| C.E. 12 | The Balance | 1.0 | 0.65 | 0.120 | X | X | X | Liquidus-Line Temperature |
| C.E. 13 | The Balance | 1.5 | 0.65 | 0.003 | ○ | X | X | |
| E. 32 | The Balance | 1.5 | 0.65 | 0.005 | ○ | Δ | Δ | |
| E. 33 | The Balance | 1.5 | 0.65 | 0.040 | ○ | ◎ | ○ | |
| E. 34 | The Balance | 1.5 | 0.65 | 0.050 | ○ | ◎ | ○ | |
| E. 35 | The Balance | 1.5 | 0.65 | 0.060 | ○ | ○ | ○ | |
| E. 36 | The Balance | 1.5 | 0.65 | 0.070 | ○ | ○ | Δ | |
| E. 37 | The Balance | 1.5 | 0.65 | 0.100 | X | Δ | Δ | |
| C.E. 14 | The Balance | 1.5 | 0.65 | 0.120 | X | X | X | Liquidus-Line Temperature |

C.E.: Comparative Example
E.: Example

TABLE 3

| | Content (% by Mass) | | | | Content of X Element | | Hardness Change before and after Reflowing (Cu—OSP Substrate) | Drop-Impact Resistance | | Other Property | |
| --- | --- | --- | --- | --- | --- | --- | --- | --- | --- | --- | --- |
| | Sn | Ag | Cu | Ni | Element | Mass ppm | | Cu—OSP Electrode | Ni/Au Electrode | Evaluation Item | Evaluation Result |
| E. 38 | The Balance | 1.2 | 0.5 | 0.050 | Sb | 10 | ○ | ◎ | ○ | Thermal | X |
| E. 39 | The Balance | 1.2 | 0.5 | 0.050 | Sb | 100 | ○ | ◎ | ○ | Fatigue | ○ |
| E. 40 | The Balance | 1.2 | 0.5 | 0.050 | Sb | 1000 | ○ | ○ | ○ | Resistance | ○ |
| E. 41 | The Balance | 1.2 | 0.5 | 0.050 | Sb | 5000 | X | Δ | Δ | | ○ |
| C.E. 15 | The Balance | 1.2 | 0.5 | 0.050 | Sb | 7500 | X | X | X | | Δ |
| E. 42 | The Balance | 1.2 | 0.5 | 0.050 | P | 1 | ○ | ◎ | ◎ | Color | X |
| E. 43 | The Balance | 1.2 | 0.5 | 0.050 | P | 5 | ○ | ◎ | ○ | Change | Δ |
| E. 44 | The Balance | 1.2 | 0.5 | 0.050 | P | 10 | ○ | ○ | ○ | | ○ |
| E. 45 | The Balance | 1.2 | 0.5 | 0.050 | P | 50 | ○ | Δ | Δ | | ○ |
| C.E. 16 | The Balance | 1.2 | 0.5 | 0.050 | P | 100 | X | X | X | | ○ |
| E. 46 | The Balance | 1.2 | 0.5 | 0.050 | Ge | 1 | ○ | ◎ | ◎ | | X |
| E. 47 | The Balance | 1.2 | 0.5 | 0.050 | Ge | 5 | ○ | ◎ | ○ | | Δ |
| E. 48 | The Balance | 1.2 | 0.5 | 0.050 | Ge | 10 | ○ | ○ | ○ | | ○ |
| E. 49 | The Balance | 1.2 | 0.5 | 0.050 | Ge | 50 | ○ | ○ | ○ | | ○ |

TABLE 3-continued

| | Content (% by Mass) | | | | Content of X Element | | Hardness Change before and after Reflowing | Drop-Impact Resistance | | Other Property | |
|---|---|---|---|---|---|---|---|---|---|---|---|
| | Sn | Ag | Cu | Ni | Element | Mass ppm | (Cu—OSP Substrate) | Cu—OSP Electrode | Ni/Au Electrode | Evaluation Item | Evaluation Result |
| E. 50 | The Balance | 1.2 | 0.5 | 0.050 | Ge | 100 | ○ | Δ | Δ | | ○ |
| C.E. 17 | The Balance | 1.2 | 0.5 | 0.050 | Ge | 200 | X | X | X | | ○ |
| E. 51 | The Balance | 1.2 | 0.5 | 0.050 | P + Ge | 1 + 1 | ○ | ⊚ | ⊚ | Color Change | X |
| E. 52 | The Balance | 1.2 | 0.5 | 0.050 | P + Ge | 5 + 5 | ○ | ⊚ | ○ | Color Change | ○ |
| E. 53 | The Balance | 1.2 | 0.5 | 0.050 | P + Ge | 10 + 10 | ○ | ⊚ | ○ | | ⊚ |
| E. 54 | The Balance | 1.2 | 0.5 | 0.050 | P + Ge | 25 + 25 | ○ | ○ | Δ | | ○ |
| E. 55 | The Balance | 1.2 | 0.5 | 0.050 | P + Ge | 50 + 50 | ○ | Δ | Δ | | ○ |
| C.E. 18 | The Balance | 1.2 | 0.5 | 0.050 | P + Ge | 50 + 75 | X | X | X | | ○ |

C.E.: Comparative Example
E.: Example

TABLE 4

| | Content (% by Mass) | | | | Content of X Element | | Hardness Change before and after Reflowing | Drop-Impact Resistance | |
|---|---|---|---|---|---|---|---|---|---|
| | Sn | Ag | Cu | Ni | Element | Mass % | (Cu—OSP Substrate) | Cu—OSP Electrode | Ni/Au Electrode |
| C.E. 19 | The Balance | 2.0 | 0.5 | ND | | | X | X | X |
| C.E. 20 | The Balance | 3.0 | 0.5 | ND | | | X | X | X |
| C.E. 21 | The Balance | 4.0 | 0.5 | ND | | | X | X | X |
| C.E. 22 | The Balance | 2.5 | 0.8 | ND | Sb | 0.5 | X | X | X |

C.E.: Comparative Example
Comment for Comparative Example: ND = Not Detectable

As is clearly seen from the results shown in Tables 1 and 2, the impact resistance was excellent when the Ni content ranged from 0.005 to 0.10% by mass. Further, the hardness change before and after reflowing was excellent when the upper limit of the Ni content was 0.07% by mass. For those containing the Ni content of 0.003% by mass, no improvement in the impact-resistant was achieved by addition of Ni. When the Ni content was 0.1% by mass, the hardness change increased before and after reflowing. Further, when the Ni content was 0.12% by mass, the impact resistance was decreased, and an increase in liquidus-line temperature was observed.

According to Table 3, improvement of the thermal fatigue resistance was observed when the Sb content was 0.01% by mass. When the Sb content was 0.5% by mass, the hardness change increased before and after reflowing. Increasing the Sb content up to 0.75% by mass resulted in the impact resistance getting worse.

Likewise, according to Table 3, the color change property was improved when the P content was 0.0005% or more by mass and the Ge content was 0.0005% or more by mass. On the other hand, when the P content was 0.01% by mass, the Ge content was 0.02% by mass, or the P+Ge content was 0.0125% by mass, then the impact resistant was decreased and the hardness change before and after reflowing was increased. According to Table 4, the impact resistance and the hardness change became worse for the Ni-free comparative examples.

(2) Examples of the Second Embodiment

Using solder alloys comprised of the respective contents shown in Tables 5 to 10, solder balls having a diameter of 300 µm were prepared. Meanwhile, the examples and the comparative examples shown in Tables 5 to 10 were prepared separately from those shown in Tables 1 to 4.

As a substrate having an electrode joined to a solder ball, an FR-4 printed-wiring board was used. The printed-wiring board was 160 by 64 mm in size, having 0.8 mm thickness. 324 electrodes having a diameter of 240 µm were arranged on the printed-wiring board. As the electrodes, two types of the electrodes were used: the one using Cu—OSP and the other using Ni (3 to 5 µm plated)/Au (0.03 to 0.05 µm plated). A silicon chip of 9.6 mm square and 0.7 mm thickness was used as a surface-mounted component joined to the above-mentioned printed-wiring board via the solder balls. 324 electrodes having a diameter of 240 µm were arranged on the silicon chip in the positions corresponding to the electrodes on the printed-wiring board. The material of the electrode was comprised of Cr (0.07 µm)/Ni (0.8 µm)/Au (0.1 µm). It was designed such that the circuit connecting the respective electrodes in series was formed when the electrodes of the printed-wiring board and those of the silicon chip were joined together through the solder joints.

As a mounting process, the solder balls were first mounted on the electrodes on the above-mentioned silicon chip side and then allowed to undergo a reflow process to form solder bumps. Then, the silicon chip on which the solder bumps were formed was flip-chip bonded to the printed-wiring board and allowed to undergo a reflow process at a peak temperature of 250 deg C. to join the electrodes of the silicon chip to those of the printed-wiring board, and thus an evaluation member was formed.

A drop-impact resistance was evaluated by using a fully automatic impact testing machine BIT-600S produced by T-Tec corporation. The evaluation member joined as above was placed on a surface plate with the silicon chip side down. Next, a rod type probe of 30 g by mass was made to drop from a height of 5 cm on the evaluation member. The impact acceleration applied to the evaluation member was monitored by an acceleration sensor (produced by TEAC Company). The impact acceleration on the evaluation member was in the range of 8,000 G to 12,000 G.

For the evaluation of fracture, the above-mentioned circuit in the evaluation member was connected to a constant current power supply to monitor the voltage, and the number of drops carried out repeatedly until the resistance value became twice as high as the initial value was defined as the drop-impact resistant drop count. Then, a measuring instrument having a sampling rate of 1 MHz was used for recognition of an instantaneous fracture caused by the deflection of the dropping substrate as fracture.

For evaluation of the drop-impact resistance of the substrate using the Cu—OSP electrode, if the number of drops carried out repeatedly until the occurrence of fracture was in a range of 0 to 30, then it was rated as x; if in a range of 31 to 40, then rated as Δ; if in a range of 41 to 80, then rated as ○; if in a range of 81 to 120, then rated as ◎; and if 121 or more, then rated as ◎◎. On the other hand, for the substrate using the Ni/Au electrode, if the number of drops carried out repeatedly until the occurrence of fracture was in a range of 0 to 20, then it was rated as x; if in a range of 21 to 30, then rated as Δ; if in a range of 31 to 40, then rated as ○; if in a range of 41 to 60, then rated as ◎; and if 61 or more, then rated as ◎◎, respectively.

Using the same surface-mounted component (Cu—OSP electrode) as the one for testing the drop-impact resistance, thermal fatigue resistance was evaluated by measuring the number of repetitions (number of thermal cycles) of a high-temperature step and a low-temperature step that were carried out by holding the component at −40 deg C. for 20 minutes and then holding the same at 125 deg C. for 20 minutes and continued until the fracture of the circuit occurred. If the number of repetitions at which the fracture started to occur was 1000 or more, then it was rated as ○, while if 750 or more, then it was rated as Δ, and if 500 or less, it was rated as x.

The evaluation of color change was carried out in such a manner that the prepared solder balls for evaluation were put on a porcelain square plate and held at 150 deg C. for 200 hours in the atmosphere, and then a sensory test with naked-eye was carried out to compare with a sample in an initial condition. When there was no change observed, it was rated as ○. The solder ball of Sn-3.0Ag-0.5Cu which showed the greatest change was rated as x, and the one which showed the intermediary color change was rated as Δ.

(2)-1 First Examples

In Tables 5 and 6, the examples containing Sn, Ag, Cu, Ni and Fe are listed. In Table 7, the examples containing Sb, P, Ge, Cr, or V, as selected elements, in addition to Sn, Ag, Cu, Ni and Fe are listed. In Table 8, the comparative examples Ni and Fe free are listed.

TABLE 5

| | Content (% by Mass) | | | | | Drop-Impact Resistance | | Other |
|---|---|---|---|---|---|---|---|---|
| | Sn | Ag | Cu | Ni | Fe | Cu—OSP Electrode | Ni/Au Electrode | Degraded Property |
| E. 1 | The Balance | 1.0 | 0.3 | 0.005 | 0.0010 | Δ | Δ | |
| E. 2 | The Balance | 1.0 | 0.3 | 0.005 | 0.0050 | Δ | Δ | |
| E. 3 | The Balance | 1.0 | 0.3 | 0.040 | 0.0010 | ◎◎ | ◎ | |
| E. 4 | The Balance | 1.0 | 0.3 | 0.040 | 0.0050 | ○ | ○ | |
| E. 5 | The Balance | 1.0 | 0.3 | 0.050 | 0.0010 | ◎◎ | ◎ | |
| E. 6 | The Balance | 1.0 | 0.3 | 0.050 | 0.0050 | ○ | ○ | |
| E. 7 | The Balance | 1.0 | 0.3 | 0.060 | 0.0010 | ◎ | ◎ | |
| E. 8 | The Balance | 1.0 | 0.3 | 0.060 | 0.0050 | ○ | ○ | |
| E. 9 | The Balance | 1.0 | 0.3 | 0.100 | 0.0010 | Δ | Δ | |
| E. 10 | The Balance | 1.0 | 0.3 | 0.100 | 0.0050 | Δ | Δ | |
| E. 11 | The Balance | 1.0 | 1.0 | 0.050 | 0.0010 | Δ | Δ | |
| E. 12 | The Balance | 1.0 | 1.0 | 0.050 | 0.0050 | Δ | Δ | |
| E. 13 | The Balance | 2.0 | 0.3 | 0.050 | 0.0010 | Δ | Δ | |
| E. 14 | The Balance | 2.0 | 0.3 | 0.050 | 0.0050 | Δ | Δ | |
| E. 15 | The Balance | 2.0 | 1.0 | 0.050 | 0.0010 | Δ | Δ | |
| E. 16 | The Balance | 2.0 | 1.0 | 0.050 | 0.0050 | Δ | Δ | |
| C.E. 1 | The Balance | 1.2 | 0.5 | 0.003 | <0.0001 | X | X | |
| E. 17 | The Balance | 1.2 | 0.5 | 0.005 | 0.0010 | ○ | ○ | |
| E. 18 | The Balance | 1.2 | 0.5 | 0.005 | 0.0050 | Δ | Δ | |
| E. 19 | The Balance | 1.2 | 0.5 | 0.030 | 0.0010 | ◎◎ | ◎ | |
| E. 20 | The Balance | 1.2 | 0.5 | 0.030 | 0.0050 | ◎ | ◎ | |
| E. 21 | The Balance | 1.2 | 0.5 | 0.040 | 0.0010 | ◎◎ | ◎ | |
| E. 22 | The Balance | 1.2 | 0.5 | 0.040 | 0.0050 | ◎ | ◎ | |
| E. 23 | The Balance | 1.2 | 0.5 | 0.050 | 0.0001 | ◎ | ◎ | |
| E. 24 | The Balance | 1.2 | 0.5 | 0.050 | 0.0010 | ◎◎ | ◎◎ | |
| E. 25 | The Balance | 1.2 | 0.5 | 0.050 | 0.0050 | ◎ | ◎ | |
| C.E. 2 | The Balance | 1.2 | 0.5 | 0.050 | 0.0075 | ○ | ○ | Solderability |
| E. 27 | The Balance | 1.2 | 0.5 | 0.060 | 0.0010 | ◎◎ | ◎ | |
| E. 28 | The Balance | 1.2 | 0.5 | 0.060 | 0.0050 | ◎ | ◎ | |
| E. 29 | The Balance | 1.2 | 0.5 | 0.100 | 0.0010 | Δ | Δ | |
| E. 30 | The Balance | 1.2 | 0.5 | 0.100 | 0.0050 | Δ | Δ | |
| C.E. 3 | The Balance | 1.2 | 0.5 | 0.120 | 0.0050 | X | X | Liquidus-Line Temperature |

C.E.: Comparative Example
E.: Example

TABLE 6

| | Content (% by Mass) | | | | | Drop-Impact Resistance | | Other |
|---|---|---|---|---|---|---|---|---|
| | Sn | Ag | Cu | Ni | Fe | Cu—OSP Electrode | Ni/Au Electrode | Degraded Property |
| C.E. 4 | The Balance | 1.0 | 0.65 | 0.003 | <0.0001 | X | X | |
| E. 31 | The Balance | 1.0 | 0.65 | 0.005 | 0.0010 | ○ | ○ | |
| E. 32 | The Balance | 1.0 | 0.65 | 0.005 | 0.0050 | ○ | ○ | |
| E. 33 | The Balance | 1.0 | 0.65 | 0.040 | 0.0010 | ⊚ | ⊚ | |
| E. 34 | The Balance | 1.0 | 0.65 | 0.040 | 0.0050 | ○ | ○ | |
| E. 35 | The Balance | 1.0 | 0.65 | 0.050 | 0.0001 | ○ | ○ | |
| E. 36 | The Balance | 1.0 | 0.65 | 0.050 | 0.0010 | ⊚ | ⊚ | |
| E. 37 | The Balance | 1.0 | 0.65 | 0.050 | 0.0050 | ○ | ○ | |
| C.E. 5 | The Balance | 1.0 | 0.65 | 0.050 | 0.0075 | ○ | ○ | Solderability |
| E. 39 | The Balance | 1.0 | 0.65 | 0.060 | 0.0010 | ⊚ | ⊚ | |
| E. 40 | The Balance | 1.0 | 0.65 | 0.060 | 0.0050 | ○ | ○ | |
| E. 41 | The Balance | 1.0 | 0.65 | 0.100 | 0.0010 | Δ | Δ | |
| E. 42 | The Balance | 1.0 | 0.65 | 0.100 | 0.0050 | Δ | Δ | |
| C.E. 6 | The Balance | 1.0 | 0.65 | 0.120 | 0.0050 | X | X | Liquidus-Line Temperature |
| C.E. 7 | The Balance | 1.5 | 0.65 | 0.003 | <0.0001 | X | X | |
| E. 43 | The Balance | 1.5 | 0.65 | 0.005 | 0.0010 | ○ | ○ | |
| E. 44 | The Balance | 1.5 | 0.65 | 0.005 | 0.0050 | ○ | ○ | |
| E. 45 | The Balance | 1.5 | 0.65 | 0.040 | 0.0010 | ⊚ | ⊚ | |
| E. 46 | The Balance | 1.5 | 0.65 | 0.040 | 0.0050 | ○ | ○ | |
| E. 47 | The Balance | 1.5 | 0.65 | 0.050 | 0.0001 | ○ | ○ | |
| E. 48 | The Balance | 1.5 | 0.65 | 0.050 | 0.0010 | ⊚ | ⊚ | |
| E. 49 | The Balance | 1.5 | 0.65 | 0.050 | 0.0050 | ○ | ○ | |
| C.E. 8 | The Balance | 1.5 | 0.65 | 0.050 | 0.0075 | ○ | ○ | Solderability |
| E. 51 | The Balance | 1.5 | 0.65 | 0.060 | 0.0010 | ⊚ | ⊚ | |
| E. 52 | The Balance | 1.5 | 0.65 | 0.060 | 0.0050 | ○ | ○ | |
| E. 53 | The Balance | 1.5 | 0.65 | 0.100 | 0.0010 | Δ | Δ | |
| E. 54 | The Balance | 1.5 | 0.65 | 0.100 | 0.0050 | Δ | Δ | |
| C.E. 9 | The Balance | 1.5 | 0.65 | 0.120 | 0.0050 | X | X | Liquidus-Line Temperature |

C.E.: Comparative Example
E.: Example

TABLE 7

| | Content (% by Mass) | | | | | Content of X Element | | Drop-Impact Resistance | | Other Property | |
|---|---|---|---|---|---|---|---|---|---|---|---|
| | Sn | Ag | Cu | Ni | Fe | Element | Mass ppm | Cu—OSP Electrode | Ni/Au Electrode | Evaluation Item | Evaluation Result |
| E. 55 | The Balance | 1.2 | 0.5 | 0.050 | 0.0010 | Sb | 10 | ○ | ○ | Thermal Fatigue Resistance | X |
| E. 56 | The Balance | 1.2 | 0.5 | 0.050 | 0.0010 | Sb | 100 | ○ | ○ | | ○ |
| E. 57 | The Balance | 1.2 | 0.5 | 0.050 | 0.0010 | Sb | 500 | ○ | ○ | | ○ |
| E. 58 | The Balance | 1.2 | 0.5 | 0.050 | 0.0010 | Sb | 5000 | Δ | Δ | | ○ |
| C.E. 10 | The Balance | 1.2 | 0.5 | 0.050 | 0.0010 | Sb | 7500 | X | X | | Δ |
| E. 59 | The Balance | 1.2 | 0.5 | 0.050 | 0.0010 | P | 1 | ⊚ | ⊚ | Color Change | X |
| E. 60 | The Balance | 1.2 | 0.5 | 0.050 | 0.0010 | P | 5 | ○ | ○ | | Δ |
| E. 61 | The Balance | 1.2 | 0.5 | 0.050 | 0.0010 | P | 10 | ○ | ○ | | ○ |
| E. 62 | The Balance | 1.2 | 0.5 | 0.050 | 0.0010 | P | 50 | Δ | Δ | | ○ |
| C.E. 11 | The Balance | 1.2 | 0.5 | 0.050 | 0.0010 | P | 100 | X | X | | ○ |
| E. 63 | The Balance | 1.2 | 0.5 | 0.050 | 0.0010 | Ge | 1 | ⊚ | ⊚ | | X |
| E. 64 | The Balance | 1.2 | 0.5 | 0.050 | 0.0010 | Ge | 5 | ○ | ○ | | Δ |
| E. 65 | The Balance | 1.2 | 0.5 | 0.050 | 0.0010 | Ge | 10 | ○ | ○ | | ○ |
| E. 66 | The Balance | 1.2 | 0.5 | 0.050 | 0.0010 | Ge | 50 | ○ | ○ | | ○ |
| E. 67 | The Balance | 1.2 | 0.5 | 0.050 | 0.0010 | Ge | 100 | Δ | Δ | | ○ |
| C.E. 12 | The Balance | 1.2 | 0.5 | 0.050 | 0.0010 | Ge | 200 | X | X | | ○ |
| E. 68 | The Balance | 1.2 | 0.5 | 0.050 | 0.0010 | P + Ge | 1 + 1 | ⊚ | ⊚ | Color Change | X |
| E. 69 | The Balance | 1.2 | 0.5 | 0.050 | 0.0010 | P + Ge | 5 + 5 | ○ | ○ | | Δ |
| E. 70 | The Balance | 1.2 | 0.5 | 0.050 | 0.0010 | P + Ge | 10 + 10 | ○ | ○ | | ○ |
| E. 71 | The Balance | 1.2 | 0.5 | 0.050 | 0.0010 | P + Ge | 25 + 25 | Δ | Δ | | ○ |
| E. 72 | The Balance | 1.2 | 0.5 | 0.050 | 0.0010 | P + Ge | 50 + 50 | Δ | Δ | | ○ |
| C.E. 13 | The Balance | 1.2 | 0.5 | 0.050 | 0.0010 | P + Ge | 50 + 75 | X | X | | ○ |
| E. 73 | The Balance | 1.2 | 0.5 | 0.050 | 0.0010 | Cr | 10 | ⊚ | ○ | | |
| E. 74 | The Balance | 1.2 | 0.5 | 0.050 | 0.0010 | V | 10 | ⊚ | ○ | | |
| E. 75 | The Balance | 1.2 | 0.5 | 0.050 | 0.0010 | Cr | 50 | ○ | Δ | | |
| E. 76 | The Balance | 1.2 | 0.5 | 0.050 | 0.0010 | V | 50 | ○ | Δ | | |

C.E.: Comparative Example
E.: Example

TABLE 8

| | Content (% by Mass) | | | | | Content of X Element | | Drop-Impact Resistance | |
|---|---|---|---|---|---|---|---|---|---|
| | Sn | Ag | Cu | Ni | Fe | Element | Mass % | Cu—OSP Electrode | Ni/Au Electrode |
| C.E. 14 | The Balance | 2.0 | 0.5 | ND | <0.0001 | | | X | X |
| C.E. 15 | The Balance | 3.0 | 0.5 | ND | <0.0001 | | | X | X |
| C.E. 16 | The Balance | 4.0 | 0.5 | ND | <0.0001 | | | X | X |
| C.E. 17 | The Balance | 2.5 | 0.8 | ND | <0.0002 | Sb | 0.5 | X | X |

C.E.: Comparative Example
Comment for Comparative Example: ND = Not Detectable

In Tables 5 and 6, the drop-impact resistance was excellent and there were no problems in quality and so forth when contents of Ag, Cu, Ni and Fe were within the range of the present invention. The drop-impact resistance was evaluated as A when the contents of Ag, Cu, Ni and Fe were at the upper limit of the range of the present invention. When the content of Ni or Fe was out of the lower limit of the range of the present invention or the Ni content was out of the upper limit of the range of the present invention, the liquidus-line temperature was increased, and the drop-impact resistance was worse. The solderability was decreased when the Fe content was out of the upper limit of the range of the present invention. The drop-impact resistance was extremely excellent when the Ag content was 1.2% by mass.

In Table 7, the thermal fatigue resistance was excellent when the Sb content was in the range of the present invention. The drop-impact resistance was worse and the thermal fatigue resistance was slightly decreased for the comparative example 10 in which the Sb content was out of the upper limit of the range of the present invention.

Likewise, in Table 7, the color change was excellent when the content of P, Ge, or mixtures thereof was within the range of the present invention. The drop-impact resistance was worse when the content of P, Ge, or mixtures thereof was out of the upper limit in the range of the present invention.

Likewise, in Table 7, the drop-impact resistance was excellent with regard to the level containing Cr or V in the range of the present invention.

In Table 8, comparative examples containing no Ni and Fe are shown. The drop-impact resistance was worse at any level.

(2)-2 Second Examples

In Tables 9 and 10, examples containing Sn, Ag, Cu, Ni, Co and Fe are shown.

TABLE 9

| | Content (% by Mass) | | | | | | Drop-Impact Resistance | |
|---|---|---|---|---|---|---|---|---|
| | Sn | Ag | Cu | Fe | Ni | Co | Cu—OSP Electrode | Ni/Au Electrode |
| E. 1 | The Balance | 1.2 | 0.5 | 0.0010 | 0.020 | 0.010 | ⊚⊚ | ⊚⊚ |
| E. 2 | | | | | 0.030 | 0.015 | ⊚⊚ | ⊚⊚ |
| E. 3 | | | | | 0.040 | 0.020 | ⊚⊚ | ⊚⊚ |
| E. 4 | | | | | 0.050 | 0.025 | ⊚⊚ | ⊚⊚ |
| E. 5 | | | | | 0.060 | 0.030 | ⊚⊚ | ⊚⊚ |
| E. 6 | | | | | 0.020 | 0.030 | ⊚ | ⊚ |
| E. 7 | | | | | 0.060 | 0.010 | ⊚ | ⊚ |
| C.E. 1 | | | | | 0.020 | 0.080 | Δ | Δ |
| C.E. 2 | | | | | 0.040 | 0.080 | X | X |
| C.E. 3 | | | | | 0.050 | 0.050 | Δ | Δ |
| C.E. 4 | | | | | 0.080 | 0.040 | X | X |
| C.E. 5 | | | | | 0.100 | 0.050 | X | X |
| C.E. 6 | | | | | 0.080 | 0.020 | Δ | Δ |
| E. 11 | The Balance | 1.2 | 0.5 | 0.0050 | 0.020 | 0.010 | ⊚⊚ | ⊚⊚ |
| E. 12 | | | | | 0.030 | 0.015 | ⊚⊚ | ⊚⊚ |
| E. 13 | | | | | 0.040 | 0.020 | ⊚⊚ | ⊚⊚ |
| E. 14 | | | | | 0.050 | 0.025 | ⊚⊚ | ⊚⊚ |
| E. 15 | | | | | 0.060 | 0.030 | ⊚⊚ | ⊚⊚ |
| E. 16 | | | | | 0.020 | 0.030 | ⊚ | ⊚ |
| E. 17 | | | | | 0.060 | 0.010 | ⊚ | ⊚ |
| C.E. 7 | | | | | 0.020 | 0.080 | Δ | X |
| C.E. 8 | | | | | 0.040 | 0.080 | X | X |
| C.E. 9 | | | | | 0.050 | 0.050 | X | X |
| C.E. 10 | | | | | 0.080 | 0.040 | X | X |
| C.E. 11 | | | | | 0.100 | 0.050 | X | X |
| C.E. 12 | | | | | 0.080 | 0.020 | X | X |
| E. 18 | The Balance | 1.0 | 0.5 | 0.0010 | 0.020 | 0.010 | ⊚ | ⊚ |
| E. 19 | | | | | 0.030 | 0.015 | ⊚ | ⊚ |
| E. 20 | | | | | 0.040 | 0.020 | ⊚ | ⊚ |
| E. 21 | | | | | 0.050 | 0.025 | ⊚ | ⊚ |
| E. 22 | | | | | 0.060 | 0.030 | ⊚ | ⊚ |
| E. 23 | | | | | 0.020 | 0.030 | ○ | ○ |
| E. 24 | | | | | 0.060 | 0.010 | ○ | ○ |
| C.E. 13 | | | | | 0.020 | 0.080 | X | X |
| C.E. 14 | | | | | 0.040 | 0.080 | X | X |
| C.E. 15 | | | | | 0.050 | 0.050 | Δ | X |
| C.E. 16 | | | | | 0.080 | 0.040 | X | X |
| C.E. 17 | | | | | 0.100 | 0.050 | X | X |
| C.E. 18 | | | | | 0.080 | 0.020 | Δ | X |

C.E.: Comparative Example
E.: Example

TABLE 10

| | | Content (% by Mass) | | | | | Drop-Impact Resistance | |
|---|---|---|---|---|---|---|---|---|
| | | Sn | Ag | Cu | Fe | Ni | Co | Cu—OSP Electrode | Ni/Au Electrode |
| E. 28 | The Balance | 1.0 | 0.5 | 0.0050 | 0.020 | 0.010 | ⊚ | ⊚ |
| E. 29 | | | | | 0.030 | 0.015 | ⊚ | ⊚ |
| E. 30 | | | | | 0.040 | 0.020 | ⊚ | ⊚ |
| E. 31 | | | | | 0.050 | 0.025 | ⊚ | ⊚ |
| E. 32 | | | | | 0.060 | 0.030 | ⊚ | ⊚ |
| E. 33 | | | | | 0.020 | 0.030 | ○ | ○ |
| E. 34 | | | | | 0.060 | 0.010 | ○ | ○ |
| C.E. 19 | | | | | 0.020 | 0.080 | X | X |
| C.E. 20 | | | | | 0.040 | 0.080 | X | X |
| C.E. 21 | | | | | 0.050 | 0.050 | △ | X |
| C.E. 22 | | | | | 0.080 | 0.040 | X | X |
| C.E. 23 | | | | | 0.100 | 0.050 | X | X |
| C.E. 24 | | | | | 0.080 | 0.020 | X | X |
| E. 35 | The Balance | 2.0 | 0.5 | 0.0010 | 0.020 | 0.010 | ⊚ | ⊚ |
| E. 36 | | | | | 0.030 | 0.015 | ⊚ | ⊚ |
| E. 37 | | | | | 0.040 | 0.020 | ⊚ | ⊚ |
| E. 38 | | | | | 0.050 | 0.025 | ⊚ | ⊚ |
| E. 39 | | | | | 0.060 | 0.030 | ⊚ | ⊚ |
| E. 40 | | | | | 0.020 | 0.030 | ○ | ○ |
| E. 41 | | | | | 0.060 | 0.010 | ○ | ○ |
| C.E. 25 | | | | | 0.020 | 0.080 | X | X |
| C.E. 26 | | | | | 0.040 | 0.080 | X | X |
| C.E. 27 | | | | | 0.050 | 0.050 | △ | X |
| C.E. 28 | | | | | 0.080 | 0.040 | X | X |
| C.E. 29 | | | | | 0.100 | 0.050 | X | X |
| C.E. 30 | | | | | 0.080 | 0.020 | △ | X |
| E. 45 | The Balance | 2.0 | 0.5 | 0.0050 | 0.020 | 0.010 | ⊚ | ⊚ |
| E. 46 | | | | | 0.030 | 0.015 | ⊚ | ⊚ |
| E. 47 | | | | | 0.040 | 0.020 | ⊚ | ⊚ |
| E. 48 | | | | | 0.050 | 0.025 | ⊚ | ⊚ |
| E. 49 | | | | | 0.060 | 0.030 | ⊚ | ⊚ |
| E. 50 | | | | | 0.020 | 0.030 | ○ | ○ |
| E. 51 | | | | | 0.060 | 0.010 | ○ | ○ |
| C.E. 31 | The Balance | 3.0 | 0.5 | 0.0010 | 0.020 | 0.080 | X | X |
| C.E. 32 | | | | | 0.040 | 0.080 | X | X |
| C.E. 33 | | | | | 0.050 | 0.050 | △ | X |
| C.E. 34 | | | | | 0.080 | 0.040 | X | X |
| C.E. 35 | | | | | 0.100 | 0.050 | X | X |
| C.E. 36 | | | | | 0.080 | 0.020 | X | X |
| C.E. 37 | | | | | 0.040 | 0.020 | X | X |
| C.E. 38 | | | | | 0.0050 | 0.040 | 0.020 | X | X |
| C.E. 39 | The Balance | 4.0 | 0.5 | 0.0010 | 0.040 | 0.020 | X | X |
| C.E. 40 | | | | | 0.0050 | 0.040 | 0.020 | X | X |

C.E.: Comparative Example
E.: Example

In Tables 9 and 10, the drop-impact resistance was excellent at the level which agreed with the condition of claim 3. Among them, an extremely excellent drop-impact resistance was shown when the ratio of the contents of Ni and Co was agreed with the condition of claim 4.

In the case the Ag content was 1.2% by mass, the drop-impact resistance was extremely excellent. Among them, when the Ag content and the Ni content were 1.2% and 0.03 to 0.05% by mass respectively, the remarkably excellent drop-impact resistances were shown. For examples 2 to 4 using the Cu—OSP electrode, excellent performances were shown such that the number of drops carried out repeatedly until the occurrence of fracture for examples 2, 3 and 4 were 183, 205 and 152 respectively.

Also in other cases the Ag content was either 1.0 or 2.0% by mass, the drop-impact resistance was extremely excellent when the Ni content was 0.02% by mass. For examples 17, 24, 31 and 38, excellent performances such that the corresponding drop numbers of times were 161, 148, 158 and 137 respectively were shown.

(3) Examples of Third Embodiment

Using solder alloys comprised of the respective contents shown in Tables 11 to 15, solder balls having a diameter of 300 μm were prepared. Meanwhile, the examples and the comparative examples shown in Tables 11 to 15 were prepared separately from those shown in Tables 1 to 10.

As a substrate having an electrode joined to a solder ball, an FR-4 printed-wiring board was used. The printed-wiring board was 160 by 64 mm in size, having 0.8 mm thickness. 324 electrodes (pads) having a diameter of 250 μm were arranged in a reticular pattern, in 18 rows and 18 columns, on the printed-wiring board. As the electrodes, two types of the electrodes were used: the one using Cu—OSP and the other using Ni (3 to 5 μm plated)/Au (0.03 to 0.05 μm plated). A silicon chip of 9.6 mm square and 0.7 mm thickness was used as a surface-mounted component joined to the above-mentioned printed-wiring board via the solder balls. 324 electrodes having a diameter of 240 μm were arranged on the silicon chip in the positions corresponding to the electrodes on the printed-wiring board. The material of the electrode was comprised of Cr (0.07 μm)/Ni (0.8 μm)/Au (0.1 μm). It was designed such that circuit connecting the respective electrodes in series was formed when the electrodes of the printed-wiring board and those of the silicon chip were joined together through the solder joints.

As a mounting process, the solder balls were first mounted on the electrodes on the above-mentioned silicon chip side and then allowed to undergo a reflow process to form solder bumps. Then, the silicon chip on which the solder bumps were formed was flip-chip bonded to the printed-wiring board and allowed to undergo a reflow process at a peak temperature of 250 deg C. to join the electrodes of the silicon chip to those of the printed-wiring board, and thus an evaluation member was formed.

For the evaluation of vibration resistance performance, a reverse bend test was carried out by a three point mounting, and the support span was 100 mm; the displacement of the board was 3 mm; the displacement rate of the board was 60 mm/sec. Fracture was evaluated by the cyclic bending number carried out repeatedly until the electric resistance became twice as high as the initial value.

For evaluation standard of the vibration resistance using the Cu—OSP electrode, if the bending number was in a range of 0 to 999, then it was rated as x; if in a range of 1000 to 1999, then rated as △; if in a range of 2000 to 3999, then rated as ○; if in a range of 4000 to 5999, then rated as ⊚; if in a range of 6000 to 9999, then rated as ⊚○; and if 10000 or more, then rated as ⊚⊚.

On the other hand, for using the Ni Au electrode, if the bending number was in a range of 0 to 199, then it was rated as x; if in a range of 200 to 399, then rated as △; if in a range of 400 to 499, then rated as ○; if in a range of 500 to 999, then rated as ⊚; if in a range of 1000 to 1999, then rated as ⊚○; and if 2000 or more, then rated as ⊚⊚, respectively.

The results will be shown in Tables 11 to 15.

TABLE 11

| | Content (% by Mass) | | | | | | | Result of Cyclic Bending Property | |
|---|---|---|---|---|---|---|---|---|---|
| | Sn | Ag | Cu | Ni | Fe | Co | The Other Element | Cu—OSP Electrode | Ni/Au Electrode |
| C.E. 0 | The Balance | 1.0 | 0.3 | 0.001 | | | | X | X |
| E. 1 | | | | 0.005 | | | | Δ | Δ |
| E. 2 | | | | 0.030 | | | | ○ | ○ |
| E. 3 | | | | 0.050 | | | | ⊚ | ⊚ |
| E. 4 | | | | 0.060 | | | | ⊚ | ○ |
| E. 5 | | | | 0.100 | | | | Δ | Δ |
| C.E. 1 | | | | 0.120 | | | | X | X |
| C.E. 2 | | | 1.0 | 0.001 | | | | X | X |
| E. 6 | | | | 0.005 | | | | Δ | Δ |
| E. 7 | | | | 0.030 | | | | ○ | ○ |
| E. 8 | | | | 0.050 | | | | ⊚ | ⊚ |
| E. 9 | | | | 0.060 | | | | ○ | ○ |
| E. 10 | | | | 0.100 | | | | Δ | Δ |
| C.E. 3 | | | | 0.120 | | | | X | X |
| C.E. 4 | | 2.0 | 0.3 | 0.001 | | | | X | X |
| E. 11 | | | | 0.005 | | | | Δ | Δ |
| E. 12 | | | | 0.030 | | | | ○ | ○ |
| E. 13 | | | | 0.050 | | | | ⊚ | ⊚ |
| E. 14 | | | | 0.060 | | | | ○ | ○ |
| E. 15 | | | | 0.100 | | | | Δ | Δ |
| C.E. 5 | | | | 0.120 | | | | X | X |
| C.E. 6 | | | 1.0 | 0.001 | | | | X | X |
| E. 16 | | | | 0.005 | | | | Δ | Δ |
| E. 17 | | | | 0.030 | | | | ○ | ○ |
| E. 18 | | | | 0.050 | | | | ⊚ | ⊚ |
| E. 19 | | | | 0.060 | | | | ○ | ○ |
| E. 20 | | | | 0.100 | | | | Δ | Δ |
| C.E. 7 | | | | 0.120 | | | | X | X |
| C.E. 8 | | 1.2 | 0.5 | 0.001 | | | | X | X |
| E. 21 | | | | 0.005 | | | | Δ | Δ |
| E. 22 | | | | 0.030 | | | | ○ | ○ |
| E. 23 | | | | 0.050 | | | | ⊚○ | ⊚○ |
| E. 24 | | | | 0.060 | | | | ⊚ | ○ |
| E. 25 | | | | 0.100 | | | | Δ | Δ |
| C.E. 9 | | | | 0.120 | | | | X | X |

C.E.: Comparative Example
E.: Example

TABLE 12

| | Content (% by Mass) | | | | | | | Result of Cyclic Bending Property | | Other |
|---|---|---|---|---|---|---|---|---|---|---|
| | Sn | Ag | Cu | Ni | Fe | Co | The Other Element | Cu—OSP Electrode | Ni/Au Electrode | Degraded Property |
| E. 26 | The Balance | 1.0 | 0.3 | 0.030 | ND | | | ○ | ○ | |
| E. 27 | | | | 0.030 | 0.0001 | | | ⊚ | ⊚ | |
| E. 28 | | | | 0.030 | 0.0005 | | | ⊚○ | ⊚○ | |
| E. 29 | | | | 0.030 | 0.0050 | | | ⊚ | ⊚ | |
| C.E. 10 | | | | 0.030 | 0.0100 | | | — | — | Surficial Roughness, Solderability Decrease |
| E. 30 | | 1.0 | | 0.030 | ND | | | ○ | ○ | |
| E. 31 | | | | 0.030 | 0.0001 | | | ⊚ | ⊚ | |
| E. 32 | | | | 0.030 | 0.0005 | | | ⊚○ | ⊚○ | |
| E. 33 | | | | 0.030 | 0.0050 | | | ⊚ | ⊚ | |
| C.E. 11 | | | | 0.030 | 0.0100 | | | — | — | Surficial Roughness, Solderability Decrease |
| E. 34 | | 2.0 | 0.3 | 0.030 | ND | | | ○ | ○ | |
| E. 35 | | | | 0.030 | 0.0001 | | | ⊚ | ⊚ | |
| E. 36 | | | | 0.030 | 0.0005 | | | ⊚○ | ⊚○ | |
| E. 37 | | | | 0.030 | 0.0050 | | | ⊚ | ⊚ | |
| C.E. 12 | | | 1.0 | 0.030 | 0.0100 | | | — | — | Surficial Roughness, Solderability Decrease |
| E. 38 | | | | 0.030 | ND | | | ○ | ○ | |
| E. 39 | | | | 0.030 | 0.0001 | | | ⊚ | ⊚ | |
| E. 40 | | | | 0.030 | 0.0005 | | | ⊚○ | ⊚○ | |
| E. 41 | | | | 0.030 | 0.0050 | | | ⊚ | ⊚ | |
| C.E. 13 | | | | 0.030 | 0.0100 | | | — | — | Surficial Roughness, Solderability Decrease |
| E. 42 | | 1.2 | 0.5 | 0.030 | ND | | | ○ | ○ | |
| E. 43 | | | | 0.030 | 0.0001 | | | ⊚ | ⊚○ | |
| E. 44 | | | | 0.030 | 0.0005 | | | ⊚○ | ⊚○ | |
| E. 45 | | | | 0.030 | 0.0050 | | | ⊚ | ⊚ | |
| C.E. 14 | | | | 0.030 | 0.0100 | | | — | — | Surficial Roughness, Solderability Decrease |

C.E.: Comparative Example
E.: Example

TABLE 13

| | Content (% by Mass) | | | | | | | Result of Cyclic | | |
| --- | --- | --- | --- | --- | --- | --- | --- | --- | --- | --- |
| | | | | | | | | The Other | Bending Property | | Other Degraded |
| | Sn | Ag | Cu | Ni | Fe | Co | Ni + Fe + Co | Element | Cu—OSP Electrode | Ni/Au Electrode | Property |
| E. 46 | The Balance | 1.0 | 0.3 | 0.030 | | 0.001 | 0.031 | | ○ | ○ | |
| E. 47 | | | | 0.030 | | 0.005 | 0.035 | | ◎ | ◎ | |
| E. 48 | | | | 0.030 | | 0.040 | 0.070 | | ◎○ | ◎○ | |
| E. 49 | | | | 0.030 | | 0.100 | 0.130 | | ○ | ○ | |
| C.E. 15 | | | | 0.030 | | 0.120 | 0.150 | | — | — | Melting Point Increase |
| E. 50 | | | 1.0 | 0.030 | | 0.001 | 0.031 | | ○ | ○ | |
| E. 51 | | | | 0.030 | | 0.005 | 0.035 | | ◎ | ◎ | |
| E. 52 | | | | 0.030 | | 0.040 | 0.070 | | ◎○ | ◎○ | |
| E. 53 | | | | 0.030 | | 0.100 | 0.130 | | ○ | ○ | |
| C.E. 16 | | | | 0.030 | | 0.120 | 0.150 | | — | — | Melting Point Increase |
| E. 54 | | 2.0 | 0.3 | 0.030 | | 0.001 | 0.031 | | ○ | ○ | |
| E. 55 | | | | 0.030 | | 0.005 | 0.035 | | ◎ | ◎ | |
| E. 56 | | | | 0.030 | | 0.040 | 0.070 | | ◎○ | ◎○ | |
| E. 57 | | | | 0.030 | | 0.100 | 0.130 | | ○ | ○ | |
| C.E. 17 | | | 1.0 | 0.030 | | 0.120 | 0.150 | | | | Meting Point Increase |
| E. 58 | | | | 0.030 | | 0.001 | 0.031 | | ○ | ○ | |
| E. 59 | | | | 0.030 | | 0.005 | 0.035 | | ◎ | ◎ | |
| E. 60 | | | | 0.030 | | 0.040 | 0.070 | | ◎○ | ◎○ | |
| E. 61 | | | | 0.030 | | 0.100 | 0.130 | | ○ | ○ | |
| C.E. 18 | | | | 0.030 | | 0.120 | 0.150 | | — | — | Melting Point Increase |
| E. 62 | | 1.2 | 0.5 | 0.030 | 0.0000 | 0.001 | 0.031 | | ○ | ○ | |
| E. 63 | | | | 0.030 | 0.0001 | 0.005 | 0.035 | | ◎ | ◎○ | |
| E. 64 | | | | 0.030 | 0.0005 | 0.040 | 0.071 | | ◎○ | ◎○ | |
| E. 65 | | | | 0.030 | 0.0050 | 0.100 | 0.135 | | ○ | ○ | |
| C.E. 19 | | | | 0.030 | 0.0100 | 0.120 | 0.160 | | — | — | Melting Point Increase |
| E. 71 | | 1.2 | 0.5 | 0.010 | 0.0002 | 0.003 | 0.013 | | ◎◎ | ◎◎ | |
| E. 72 | | | | 0.010 | 0.0020 | 0.007 | 0.019 | | ◎◎ | ◎◎ | |
| E. 73 | | | | 0.020 | 0.0005 | 0.006 | 0.027 | | ◎◎ | ◎◎ | |
| E. 74 | | | | 0.020 | 0.0040 | 0.012 | 0.036 | | ◎◎ | ◎◎ | |
| E. 75 | | | | 0.030 | 0.0005 | 0.020 | 0.051 | | ◎◎ | ◎◎ | |
| E. 76 | | | | 0.030 | 0.0010 | 0.020 | 0.051 | | ◎◎ | ◎◎ | |
| E. 77 | | | | 0.040 | 0.0005 | 0.015 | 0.056 | | ◎◎ | ◎◎ | |
| E. 78 | | | | 0.040 | 0.0010 | 0.015 | 0.056 | | ◎◎ | ◎◎ | |
| E. 79 | | | | 0.050 | 0.0001 | 0.015 | 0.065 | | ◎◎ | ◎◎ | |
| E. 80 | | | | 0.050 | 0.0050 | 0.035 | 0.090 | | ◎◎ | ◎◎ | |

C.E.: Comparative Example
E.: Example

TABLE 14

| | Content (% by Mass) | | | | | | | Result of Cyclic Bending Property | |
| --- | --- | --- | --- | --- | --- | --- | --- | --- | --- |
| | | | | | | | | The Other Element | |
| | Sn | Ag | Cu | Ni | Fe | Co | Ni + Fe + Co | ppm | Cu—OSP Electrode | Ni/Au Electrode |
| E. 81 | The Balance | 1.2 | 0.5 | 0.030 | 0.0005 | 0.040 | 0.071 | O: 20 | ◎◎ | ◎◎ |
| E. 82 | | | | | | | | Cr: 10, V: 10 | ◎◎ | ◎◎ |
| E. 83 | | | | | | | | Sb: 100 | ◎◎ | ◎◎ |
| E. 84 | | | | | | | | Sb: 5000 | ◎◎ | ◎◎ |
| E. 85 | | | | | | | | P: 5 | ◎◎ | ◎◎ |
| E. 86 | | | | | | | | P: 50 | ◎◎ | ◎◎ |
| E. 87 | | | | | | | | Ge: 5 | ◎◎ | ◎◎ |
| E. 88 | | | | | | | | Ge: 50 | ◎◎ | ◎◎ |
| E. 89 | | | | | | | | P: 50, Ge: 50 | ◎◎ | ◎◎ |

E.: Example

TABLE 15

| | Content (% by Mass) | | | | | | | Result of Cyclic Bending Property | |
|---|---|---|---|---|---|---|---|---|---|
| | Sn | Ag | Cu | Ni | Fe | Co | Ni + Fe + Co | The Other Element | Cu—OSP Electrode | Ni/Au Electrode |
| C.E. 20 | The Balance | 2.0 | 0.5 | ND | ND | ND | | | X | X |
| C.E. 21 | | 3.0 | 0.5 | | | | | | X | X |
| C.E. 22 | | 4.0 | 0.5 | | | | | | X | X |
| C.E. 23 | | 2.5 | 0.8 | | | | | Sb: 0.5 | X | X |

C.E.: Comparative Example

Table 11 summarizes the results of having used the solder alloys containing Ni according to the present invention. For any examples in which the Ni contents were within the range of the present invention, improvements in the reverse bending property were observed.

Table 12 summarizes the results of having used the solder alloys containing Ni and Fe according to the present invention. For any examples in which the Ni and Fe contents were each within the range of the present invention, further improvements in the reverse bending property were observed. No reverse bend test was carried out with respect to those the Fe content of which was beyond the upper limit of the range of the present invention, since coarsened soldered surfaces as well as deteriorated solderabilities were observed.

Table 13 summarizes the results of having used the solder alloys containing Ni and Co, Ni, Co and Fe, or Co and Fe according to the present invention. For any examples in which the Co contents were within the range of the present invention, the similar improvements in the reverse bending property as those of the present invention containing Ni and Co were observed. For the examples whose total contents of Ni, Co and Fe were within the range of claim 16, the reverse bending property was more excellent compared to the ones out of this range. No reverse bend test was carried out with respect to those the Co content of which was beyond the upper limit of the range of the present invention, since increase of melting point was observed. For examples 71 to 80, the reverse bending property was extremely excellent, because they contained Ni, Co and Fe, and their content ratios of Ni, Co and Fe satisfied the requirements as set forth in claim 4 cited by claim 14.

Table 14 shows the examples of the present invention that contain Ni, Co and Fe. Example 81 is the one in which its oxygen content was within the range as set forth in claim 17. Example 82 is the one in which the Cr and V contents were within the range as set forth in claim 18. Examples 83 and 84 are the ones in which the Sb content was within the range as set forth in claim 19. Examples 85 to 89 are the ones in which the P or Ge contents were within the range as set forth in claim 20. The reverse bending property was excellent in any of these samples.

Table 15 shows comparative examples that contained none of Ni, Co and Fe. The reverse bending property proved to be inferior.

The invention claimed is:

1. A lead-free solder alloy comprising:
   1.0 to 2.0% by mass of Ag;
   0.3 to 1.0% by mass of Cu;
   0.005 to 0.10% by mass of Ni;
   0.0001 to 0.005% by mass of Fe;
   0.005 to 0.10% by mass of Co; and
   a balance including Sn and unavoidable impurities,
   wherein a content ratio of Ni, Co, Fe is 10:3 to 7:0.02 to 2, respectively, and
   wherein a total content of Ni, Co and Fe is 0.0122% to 0.10% by mass.

2. The lead-free solder alloy according to claim 1, wherein a concentration of oxygen contained is 0.0020% or less by mass.

3. The lead-free solder alloy according to claim 1, further containing any one or both of 0.0005 to 0.0050% by mass of Cr and 0.0005 to 0.0050% by mass of V.

4. The lead-free solder alloy according to claim 1, further containing 0.01 to 0.5% by mass of Sb.

5. The lead-free solder alloy according to claim 1, further containing any one or both of 0.0005 to 0.005% by mass of P and 0.0005 to 0.01% by mass of Ge, wherein P+Ge is 0.01% or less by mass.

6. A solder ball comprising said lead-free solder alloy according to claim 1.

7. An electronic member including a solder bump formed by using said lead-free solder alloy according to claim 1.

8. The lead-free solder alloy for use as the automobile-mounted electronic member comprising said lead-free solder alloy according to claim 1.

9. The lead-free solder alloy for use as the automobile-mounted electronic member according to claim 8, wherein concentration of oxygen contained is 0.0020% or less by mass.

10. The lead-free solder alloy for use as the automobile-mounted electronic member according to claim 8, further containing any one or both of 0.0005 to 0.0050% by mass of Cr and 0.0005 to 0.0050% by mass of V.

11. The lead-free solder alloy for use as the automobile-mounted electronic member according to claim 8, further containing 0.01 to 0.5% by mass of Sb.

12. The lead-free solder alloy for use as the automobile-mounted electronic member according to claim 8, further containing any one or both of 0.0005 to 0.005% by mass of P and 0.0005 to 0.01% by mass of Ge, wherein P+Ge is 0.01% or less by mass.

13. The solder ball for use as the automobile-mounted electronic member, comprising said lead-free solder alloy for an automobile-mounted electronic member according to claim 8.

14. The automobile-mounted electronic member, comprising the solder bump formed by using said lead-free solder alloy for automobile-mounted electronic member according to claim 8.

15. The lead-free solder alloy according to claim 4, further containing any one or both of 0.0005 to 0.005% by mass of P and 0.0005 to 0.01% by mass of Ge, wherein P+Ge is 0.01% or less by mass.

16. The lead-free solder alloy for use as the automobile-mounted electronic member comprising said lead-free solder alloy according to claim 4.

17. The solder ball for use as the automobile-mounted electronic member, comprising said lead-free solder alloy for the automobile-mounted electronic member according to claim 16.

18. The automobile-mounted electronic member, comprising the solder bump formed by using said lead-free solder alloy for the automobile-mounted electronic member according to claim 16.

* * * * *